(12) United States Patent
Toriumi

(10) Patent No.: US 11,855,646 B2
(45) Date of Patent: Dec. 26, 2023

(54) CIRCUIT DEVICE, OSCILLATOR, AND PROCESSING SYSTEM

(71) Applicant: SEIKO EPSON CORPORATION, Tokyo (JP)

(72) Inventor: Yuichi Toriumi, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/875,882

(22) Filed: Jul. 28, 2022

(65) Prior Publication Data

US 2023/0034239 A1 Feb. 2, 2023

(30) Foreign Application Priority Data

Jul. 30, 2021 (JP) .................................. 2021-125124

(51) Int. Cl.
*H03L 1/02* (2006.01)

(52) U.S. Cl.
CPC .............. *H03L 1/026* (2013.01); *H03L 1/028* (2013.01)

(58) Field of Classification Search
CPC ............ H03L 1/026; H03L 1/028; H03L 7/06
See application file for complete search history.

(56) References Cited

U.S. PATENT DOCUMENTS

| 5,705,957 A * | 1/1998 | Oka ........................ H03L 1/026 331/158 |
| 9,214,897 B2 * | 12/2015 | Yoneyama .............. H03L 1/022 |
| 2018/0358973 A1 * | 12/2018 | Maruyama ............. H03B 5/366 |
| 2020/0195260 A1 * | 6/2020 | Sato ...................... H03L 7/0893 |

FOREIGN PATENT DOCUMENTS

JP 2001-222342 A 8/2001

* cited by examiner

*Primary Examiner* — Jeffrey M Shin
(74) *Attorney, Agent, or Firm* — Rankin, Hill & Clark LLP

(57) ABSTRACT

A circuit device includes an oscillation circuit configured to generate an oscillation signal using a resonator, a temperature sensor circuit configured to output temperature detection data, a temperature compensation circuit configured to perform, based on the temperature detection data, temperature compensation on an oscillation frequency of the oscillation signal, a memory configured to store correction data for correcting the temperature detection data to obtain a temperature, and an interface circuit configured to output the temperature detection data and the correction data.

12 Claims, 16 Drawing Sheets

CIRCUIT DEVICE, OSCILLATOR, AND PROCESSING SYSTEM

The present application is based on, and claims priority from JP Application Serial Number 2021-125124, filed Jul. 30, 2021, the disclosure of which is hereby incorporated by reference herein in its entirety.

BACKGROUND

1. Technical Field

The present disclosure relates to a circuit device, an oscillator, and a processing system.

2. Related Art

In the related art, a circuit device including an oscillation circuit that oscillates a resonator such as a quartz crystal resonator is known. Such a circuit device is provided with a temperature sensor circuit for performing temperature compensation on an oscillation frequency of the oscillation circuit. JP-A-2001-222342 discloses a real-time clock (RTC) that has a temperature compensation function and that outputs an interruption when a detected temperature is greater than a threshold value.

In the circuit device including the oscillation circuit and the temperature sensor circuit, when temperature detection data of the temperature sensor circuit can be output to the outside, a processing device outside the circuit device can effectively use the temperature detection data from the temperature sensor circuit of the circuit device to measure a temperature of surrounding environment or the like. In this case, in order to output accurate temperature detection data to the external processing device, a correction circuit for correcting a temperature detection result of the temperature sensor circuit is required to be provided inside the circuit device. However, when such a correction circuit is provided, a problem such as wasteful power consumption in the correction circuit occurs.

SUMMARY

An aspect of the present disclosure relates to a circuit device including: an oscillation circuit configured to generate an oscillation signal using a resonator; a temperature sensor circuit configured to output temperature detection data; a temperature compensation circuit configured to perform, based on the temperature detection data, temperature compensation on an oscillation frequency of the oscillation signal; a memory configured to store correction data for correcting the temperature detection data to obtain a temperature; and an interface circuit configured to output the temperature detection data and the correction data.

Another aspect of the present disclosure relates to an oscillator including: a resonator; and a circuit device, in which the circuit device includes an oscillation circuit configured to generate an oscillation signal using the resonator, a temperature sensor circuit configured to output temperature detection data, a temperature compensation circuit configured to perform, based on the temperature detection data, temperature compensation on an oscillation frequency of the oscillation signal, a memory configured to store correction data for correcting the temperature detection data to obtain a temperature, and an interface circuit configured to output the temperature detection data and the correction data.

Still another aspect of the present disclosure relates to a processing system including: the oscillator described above; and a processing device electrically coupled to the oscillator, in which the processing device performs a calculation process of correcting the temperature detection data based on the correction data and detects the temperature.

DESCRIPTION OF EXEMPLARY EMBODIMENTS

Hereinafter, an embodiment will be described. The present embodiment to be described below does not unduly limit the scope of the claims. All of the configurations described in the present embodiment are not necessarily essential constituent elements.

1. Circuit Device

Figure 1:
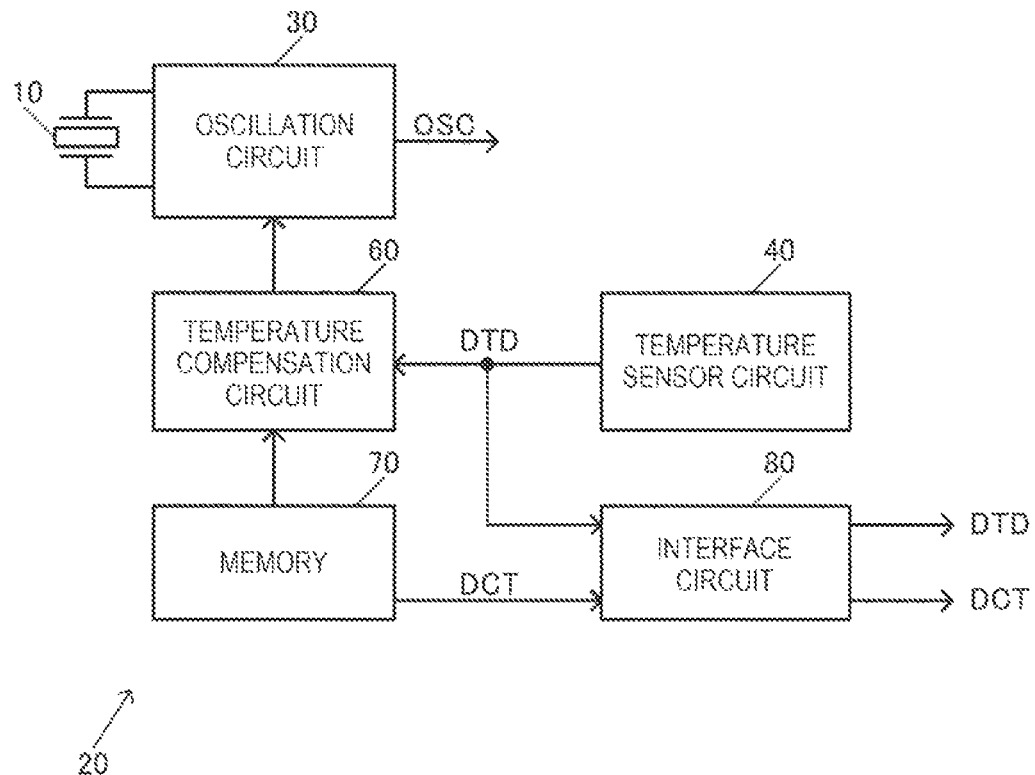
FIG. 1 is a configuration example of a circuit device according to the present embodiment.

FIG. 1 shows a configuration example of a circuit device 20 according to the present embodiment. The circuit device 20 according to the present embodiment includes an oscillation circuit 30 that oscillates a resonator 10, a temperature sensor circuit 40 that detects a temperature, a temperature compensation circuit 60 that performs temperature compensation, a memory 70 that stores information, and an interface circuit 80 that performs a communication interface process.

The resonator 10 is an element that generates mechanical oscillation according to an electric signal. The resonator 10 can be implemented by, for example, a resonator element such as a quartz crystal resonator element. For example, the resonator 10 can be implemented by a tuning fork type quartz crystal resonator element, a double-tuning fork type quartz crystal resonator element, or a quartz crystal resonator element that has a cut angle of AT cut, SC cut, or the like and that performs thickness-shear vibration. For example, the resonator 10 may be a resonator built in a temperature-compensated quartz crystal oscillator (TCXO) not equipped with an oven, or may be a resonator built in an oven controlled quartz crystal oscillator (OCXO) equipped with an oven. The resonator 10 according to the present embodiment can be implemented by various resonator elements such as a resonator element other than a tuning fork type resonator element, a double-tuning fork type resonator element, or a thickness-shear resonator element, or a piezoelectric resonator element formed of a material other than quartz crystal. For example, as the resonator 10, a surface acoustic wave (SAW) resonator, a micro electro mechanical systems (MEMS) resonator serving as a silicon resonator formed using a silicon substrate, or the like may be adopted.

The circuit device 20 is an integrated circuit device called an integrated circuit (IC). For example, the circuit device 20 is an IC manufactured by a semiconductor process, and is a semiconductor chip in which a circuit element is formed on a semiconductor substrate. In FIG. 1, the circuit device 20 includes the oscillation circuit 30, the temperature sensor circuit 40, the temperature compensation circuit 60, the memory 70, and the interface circuit 80.

The oscillation circuit 30 is a circuit that oscillates the resonator 10. For example, the oscillation circuit 30 generates an oscillation signal OSC by oscillating the resonator 10. The oscillation signal OSC is an oscillation clock signal. As an example, the oscillation circuit 30 generates the oscillation signal OSC with a frequency of, for example, 32 KHz. However, the oscillation frequency is not limited to 32 KHz. For example, the oscillation circuit 30 can be implemented by an oscillation drive circuit electrically coupled to one end and the other end of the resonator 10, and a passive element such as a capacitor or a resistor. The drive circuit can be implemented by, for example, an inverter circuit or a bipolar transistor of CMOS. The drive circuit is a core circuit of the oscillation circuit 30, and the drive circuit oscillates the resonator 10 by driving the resonator 10 based on a voltage or a current. As the oscillation circuit 30, various types of oscillation circuits such as an inverter type, a Pierce type, a Colpitts type, or a Hartley type can be used. The oscillation circuit 30 is provided with a variable capacitance circuit, and the oscillation frequency can be adjusted by adjusting a capacitance of the variable capacitance circuit. The variable capacitance circuit can be implemented by, for example, a capacitor array and a switch array coupled to the capacitor array. The variable capacitance circuit can also be implemented by a variable capacitance element such as a varactor. The coupling in the present embodiment is electrical coupling. The electrical coupling is coupling in which an electric signal can be transmitted, and coupling in which information can be transmitted through the electric signal. The electrical coupling may be coupling via a passive element or the like.

Figure 4:
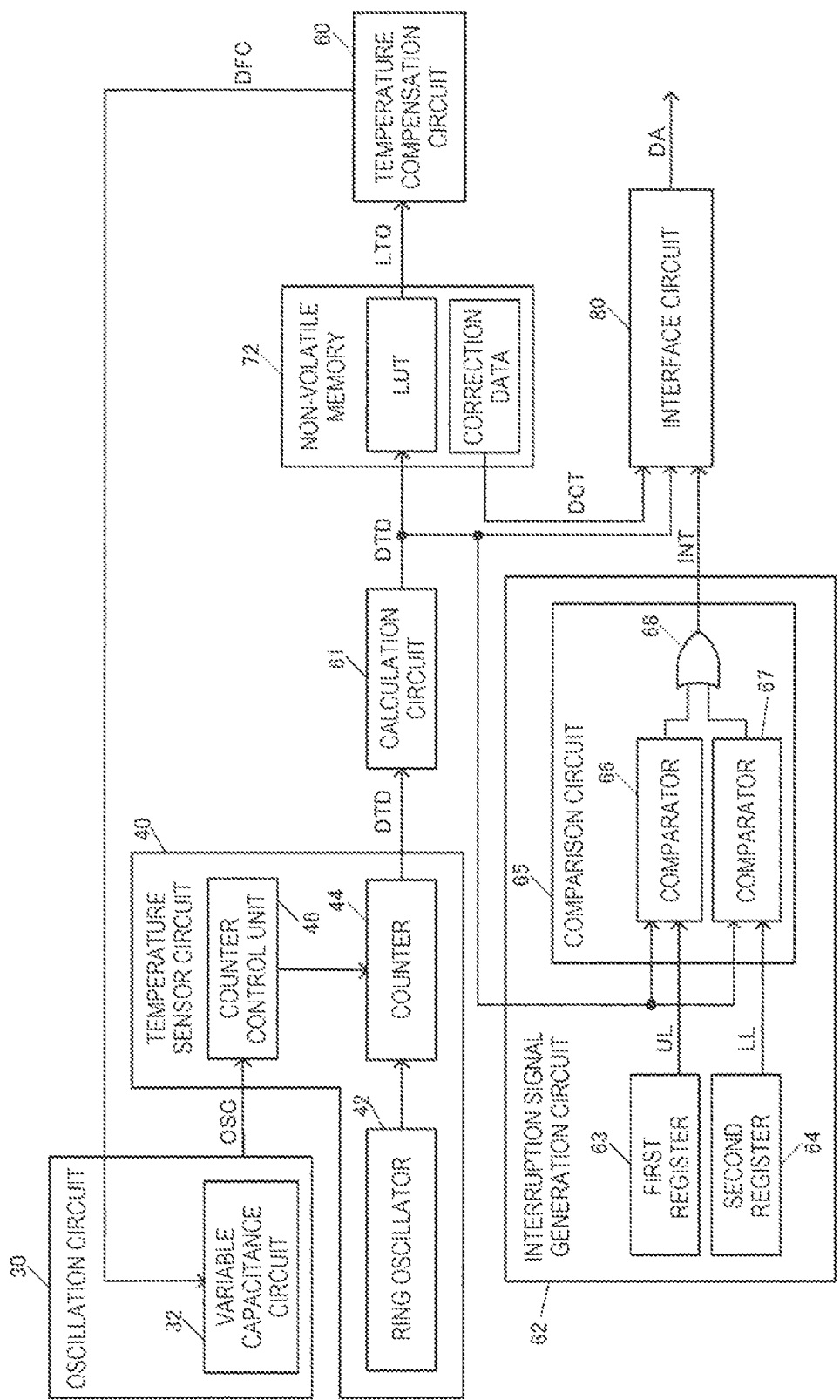
FIG. 4 is another detailed configuration example of the circuit device according to the present embodiment.

The temperature sensor circuit 40 measures a temperature such as an environmental temperature of the resonator 10 or the circuit device 20, and outputs a result of the measurement as temperature detection data DTD. The temperature detection data DTD is data that monotonically increases or monotonically decreases, for example, with respect to the temperature in an operation temperature range of the circuit device 20. As shown in FIG. 4 to be described later, the temperature sensor circuit 40 is a temperature sensor that uses temperature dependence of an oscillation frequency of a ring oscillator 42. Specifically, as shown in FIG. 4, the temperature sensor circuit 40 includes the ring oscillator 42 and a counter 44. The counter 44 counts an output pulse signal that is an oscillation signal of the ring oscillator 42 in a counting period defined by a clock signal CK generated based on the oscillation signal OSC from the oscillation circuit 30, and outputs the count value as the temperature detection data DTD. The temperature detection circuit 40 is not limited thereto, and may include, for example, an analog temperature sensor that outputs a temperature detection voltage using temperature dependence of a forward voltage of a PN junction, and an A/D conversion circuit that performs A/D conversion on the temperature detection voltage and that outputs the temperature detection data DTD.

The temperature compensation circuit 60 performs a temperature compensation process based on the temperature detection data DTD from the temperature sensor circuit 40. The temperature compensation process is, for example, a process of reducing and compensating a variation of the oscillation frequency due to a temperature variation. That is, the temperature compensation circuit 60 performs the temperature compensation process on the oscillation frequency of the oscillation circuit 30 such that the frequency is constant even when the temperature variation occurs. Specifically, the temperature compensation circuit 60 performs the temperature compensation process based on a digital calculation performed using the temperature detection data DTD from the temperature sensor circuit 40.

The memory 70 is a storage device that stores information. The memory 70 can be implemented by, for example, a semiconductor memory. For example, the memory 70 is desirably implemented by a non-volatile memory, but is not limited thereto. The memory 70 stores various kinds of information required for an operation of the circuit device 20. The memory 70 stores correction data DCT for correcting the temperature detection data DTD to obtain a temperature.

Figure 13:
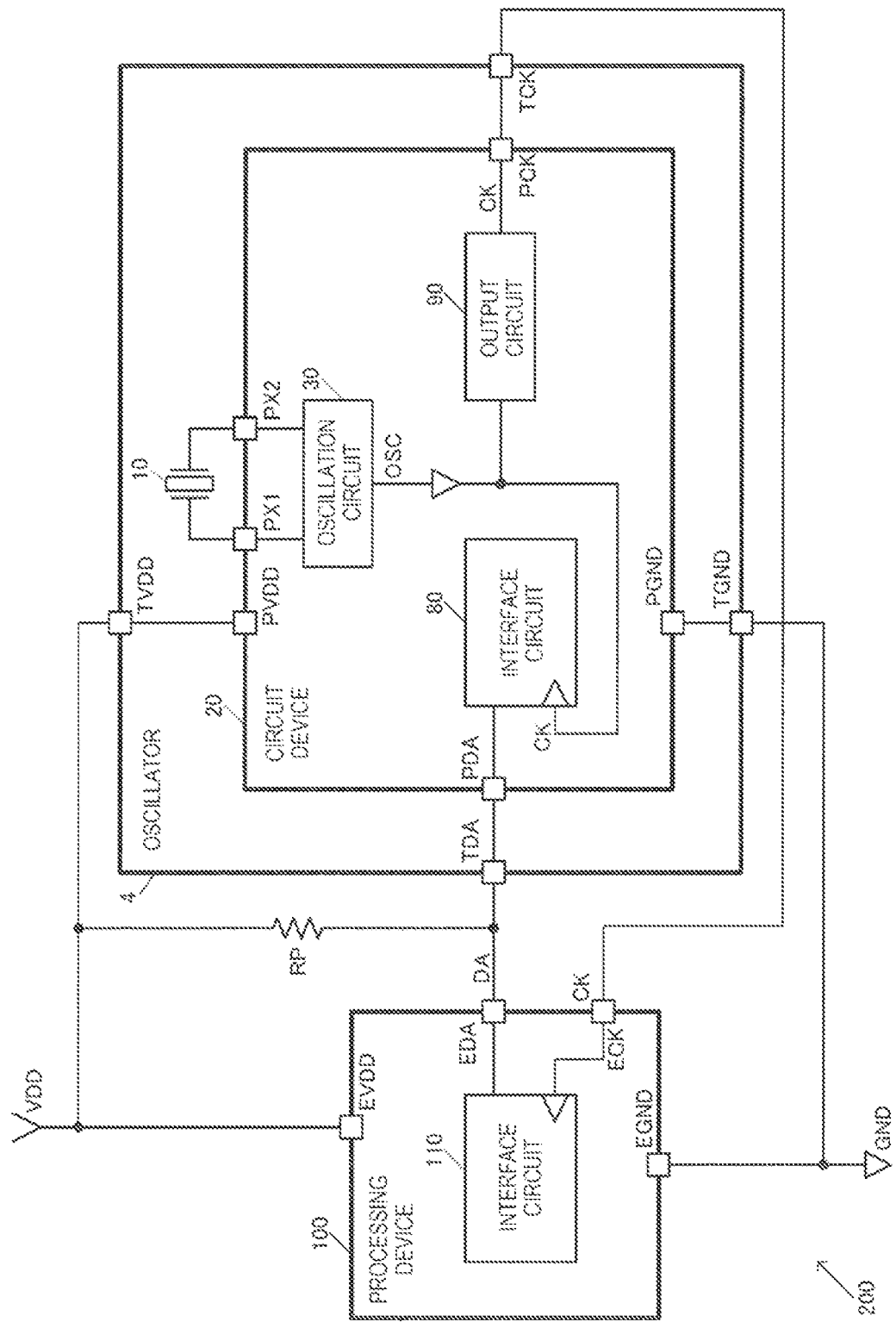
FIG. 13 is a configuration example of a processing system including an oscillator and a processing device.

The interface circuit 80 is a circuit serving as an interface with an external device, and is, for example, a circuit for performing communication with an external processing device 100 shown in FIG. 13 to be described later. In the present embodiment, the interface circuit 80 outputs the temperature detection data DTD from the temperature sensor circuit 40 and the correction data DCT from the memory 70. That is, the interface circuit 80 outputs the temperature detection data DTD and the correction data DCT to the external processing device 100. The interface circuit 80 can be implemented by, for example, a serial interface circuit that performs communication through a serial interface. For example, the interface circuit 80 may be implemented by a serial interface circuit as shown in FIG. 13 to be described later, or may be implemented by a serial interface circuit such as a serial peripheral interface (SPI) or an inter-integrated circuit (I2C). In SPI or I2C, communication through a serial interface using a serial clock signal and a serial data signal is performed. A modification using a parallel interface circuit that performs communication through a parallel interface is also possible as the interface circuit 80.

As described above, the circuit device 20 according to the present embodiment includes the oscillation circuit 30, the temperature sensor circuit 40, the temperature compensation circuit 60, the memory 70, and the interface circuit 80 as shown in FIG. 1. The oscillation circuit 30 generates the oscillation signal OSC using the resonator 10, and the temperature sensor circuit 40 detects a temperature and outputs the temperature detection data DTD. The temperature compensation circuit 60 performs the temperature compensation on the oscillation frequency of the oscillation signal OSC based on the temperature detection data DTD, and the memory 70 stores the correction data DCT for correcting the temperature detection data DTD to obtain a temperature. For example, in the case of producing or inspecting the circuit device 20 or a device in which the circuit device 20 is incorporated, such as an oscillator, the correction data DCT for obtaining the temperature based on the temperature detection data DTD output from the temperature sensor circuit 40 is calculated. Then, the calculated correction data DCT is stored in the memory 70. Then, the interface circuit 80 outputs the temperature detection data DTD and the correction data DCT to the outside. The temperature detection data DTD is data for specifying the detected temperature and is data associated with the detected temperature. The correction data DCT is data for the external processing device 100 to obtain a corresponding temperature based on the temperature detection data DTD. For example, the correction data DCT is data for correcting a variation of correspondence between the temperature and the temperature detection data DTD.

In this way, in the circuit device 20 according to the present embodiment, in addition to the temperature detection data DTD, the correction data DCT for correcting the temperature detection data DTD to obtain a temperature is output from the interface circuit 80 to the outside. Therefore, the external processing device 100 in FIG. 13 can perform a calculation process of correcting, based on the correction data DCT received from the interface circuit 80, the temperature detection data DTD similarly received from the interface circuit 80, and can measure an accurate temperature corresponding to the temperature detection data DTD.

Figure 2:
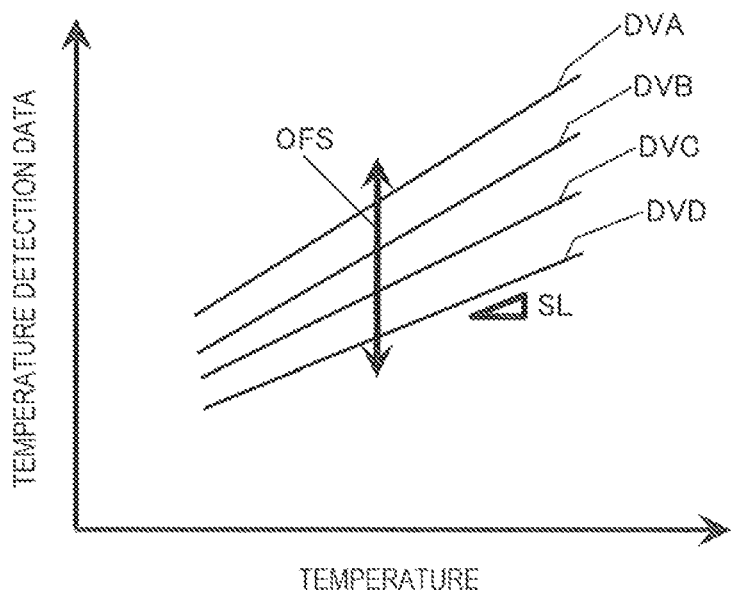
FIG. 2 is a diagram illustrating a relation between temperature detection data and a temperature.

For example, FIG. 2 shows an example of properties of the temperature detection data DTD with respect to the temperature. FIG. 2 shows exemplary properties of the temperature detection data DTD in devices DVA, DVB, DVC, and DVD. The devices DVA, DVB, DVC, and DVD correspond to the circuit device 20 or an oscillator 4 in FIG. 3 to be described later in which the circuit device 20 is incorporated. For example, a variation occurs in the properties of the temperature detection data DTD due to a variation of a process of producing the devices. For example, in the properties of the temperature detection data DTD of the devices DVA to DVD, a slope S1 or an offset OFS varies, and an individual difference variation occurs. The correction data DCT is used to correct such a variation of the properties of the temperature detection data DTD with respect to the temperature. For example, in a case of FIG. 2, the temperature can be represented as the following equation (1) using the temperature detection data DTD.

$$\text{Temperature (° C.)} = SL \times DTD + OFS \quad (1)$$

Therefore, in the case of FIG. 2, by using the slope SL and the offset OFS as the correction data DCT, an accurate temperature can be obtained based on the temperature detection data DTD even when the individual difference variation occurs. Taking the device DVA as an example, when producing or inspecting the device DVA, an external device such as a tester reads the temperature detection data DTD output from the temperature sensor circuit 40 at each temperature, whereby the slope SL and the offset OFS can be obtained as the correction data DCT. Then, the obtained correction data DCT is written in the memory 70 of the circuit device 20, and a product is shipped. Then, during an actual operation of the device DVA, the interface circuit 80 of the device DVA outputs the temperature detection data DTD of the temperature sensor circuit 40 and the correction data DCT written in the memory 70. Then, the external processing device 100 can measure the temperature by performing the calculation process of the above equation (1) as the calculation process of correcting the temperature detection data DTD based on the correction data DCT.

Here, the correction data DCT is, for example, coefficient data of a polynomial representing a relation between the temperature and the temperature detection data DTD. For example, in the above equation (1), the slope SL and the offset OFS that are the correction data DCT are coefficient data of a first-order polynomial representing the relation between the temperature and the temperature detection data DTD. More generally, the relation between the temperature and the temperature detection data DTD can be represented by, for example, a polynomial such as the following equation (2).

$$\text{Temperature (° C.)} = C_n \times DTD^n + C_{n-1} \times DTD^{n-1} \ldots + C_1 \times DTD + C_0 \quad (2)$$

In this case, the correction data DCT is $C_n$, $C_{n-1}$, ..., $C_1$, and $C_0$ that are coefficient data of the polynomial of the above equation (2). n is an integer of 1 or more. In this way, when a property indicating the relation between the temperature and the temperature detection data DTD can be represented or approximated by a polynomial such as the above equation (2), $C_n$, $C_{n-1}$, ..., $C_1$, and $C_0$ that are the coefficient data of the polynomial can be used as the correction data DCT. The external processing device 100 can measure an accurate temperature by performing the calculation process of correcting the temperature detection data DTD based on the correction data DCT.

The correction data DCT is not required to be the same in all temperature ranges, and for example, when an equalizing calculation process or the like in FIGS. 11 and 12 to be described later is performed, different correction data DCT may be set according to the temperature ranges. A correction method based on the correction data DCT according to the present embodiment is not limited to a method based on such polynomial approximation, and various modifications are possible, for example, a modification in which the memory 70 stores correspondence between the temperature and the temperature detection data DTD in a look-up table format.

2. Detailed Configuration Example

Figure 3:
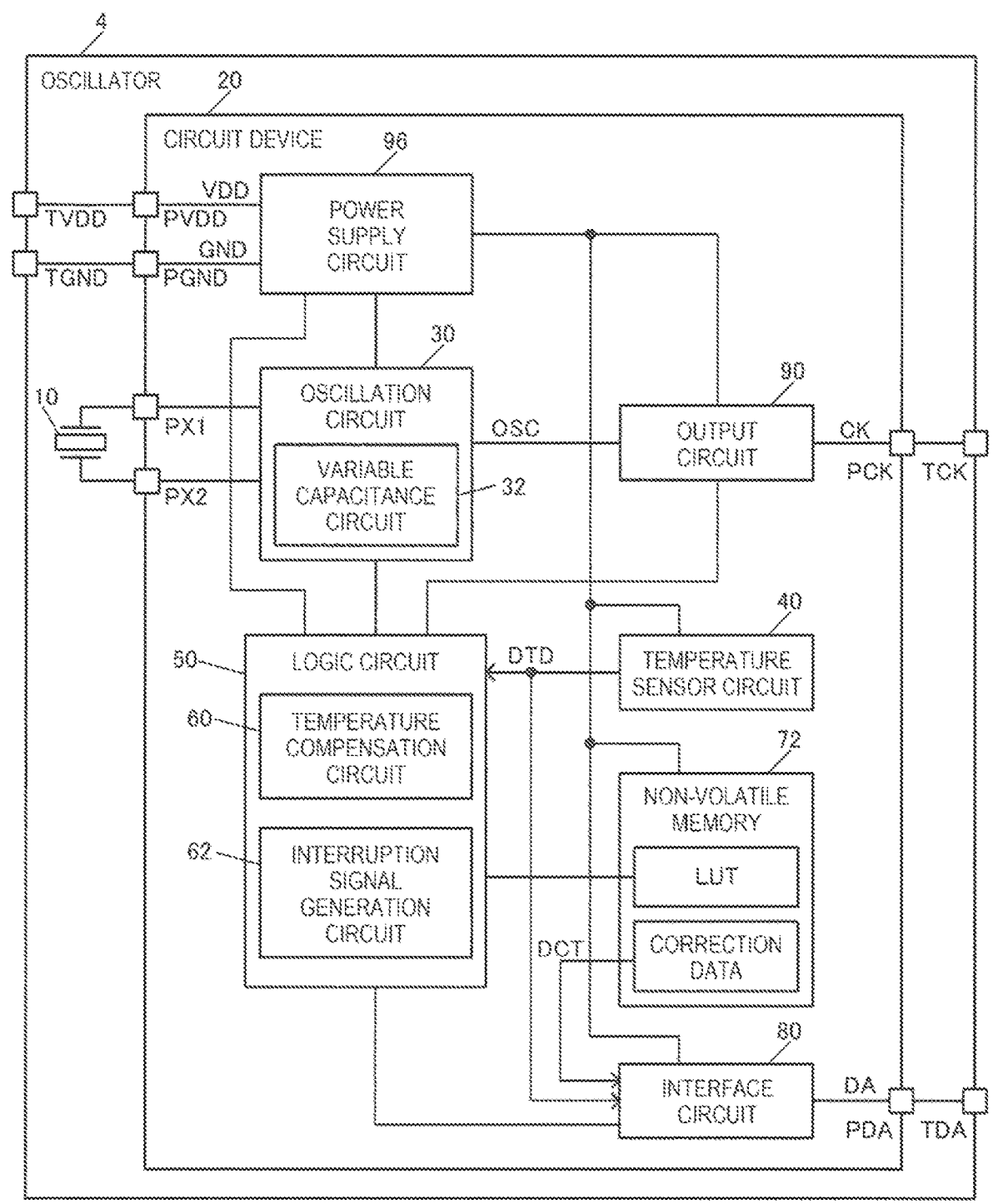
FIG. 3 is a detailed configuration example of the circuit device according to the present embodiment.

FIG. 3 shows a detailed configuration example of the circuit device 20 and the oscillator 4 including the circuit device 20 according to the present embodiment. In FIG. 3, the circuit device 20 includes the oscillation circuit 30, the temperature sensor circuit 40, a logic circuit 50, a non-volatile memory 72, the interface circuit 80, an output circuit 90, and a power supply circuit 96. The oscillator 4 includes the resonator 10 and the circuit device 20. The resonator 10 is electrically coupled to the circuit device 20. For example, the resonator 10 is electrically coupled to the circuit device 20 using an internal wiring of a package that houses the resonator 10 and the circuit device 20, a bonding wire, a metal bump, or the like.

The oscillation circuit 30 is electrically coupled to the resonator 10 via pads PX1 and PX2. The pads PX1 and PX2 are pads for coupling the resonator. The oscillation drive circuit of the oscillation circuit 30 is provided between the pad PX1 and the pad PX2. The oscillation circuit 30 includes a variable capacitance circuit 32. The variable capacitance circuit 32 includes, for example, a capacitor array and a switch array coupled to the capacitor array. Switches of the switch array of the variable capacitance circuit 32 are turned on and off based on frequency adjustment data from the temperature compensation circuit 60. For example, the variable capacitance circuit 32 includes a first capacitor array including a plurality of capacitors whose capacitance values are binary weighted. The variable capacitance circuit 32 includes a first switch array including a plurality of switches for turning on and off coupling between the pad PX1 and the capacitor of the first capacitor array. As the variable capacitance circuit 32, a first variable capacitance circuit that includes the first capacitor array and the first switch array and that is coupled to the pad PX1, and a second variable capacitance circuit that includes a second capacitor array and a second switch array and that is coupled to the pad PX2 may be provided. Switches of the first switch array and the second switch array are turned on and off based on the frequency adjustment data.

The logic circuit 50 is a control circuit and performs various control processes. For example, the logic circuit 50 controls the entire circuit device 20 or controls an operation sequence of the circuit device 20. In addition, the logic circuit 50 performs various processes for controlling the oscillation circuit 30, controls the temperature sensor circuit 40 and the power supply circuit 96, or controls to read or write information from and in the non-volatile memory 72. The logic circuit 50 can be implemented by, for example, an application specific integrated circuit (ASIC) using automatic placement and routing of a gate array, for example.

The logic circuit 50 includes the temperature compensation circuit 60 and an interruption signal generation circuit 62. The details of the interruption signal generation circuit 62 will be described in FIG. 4 to be described later.

The temperature compensation circuit 60 obtains the frequency adjustment data based on the temperature detection data DTD. Then, a temperature compensation process on the oscillation frequency of the oscillation circuit 30 is performed by adjusting the capacitance value of the variable capacitance circuit 32 of the oscillation circuit 30 based on the obtained frequency adjustment data. For example, the non-volatile memory 72 stores a look-up table LUT indicating correspondence between the temperature detection data DTD and the frequency adjustment data. The temperature compensation circuit 60 performs the temperature compensation process of obtaining the frequency adjustment data based on the temperature detection data DTD using the look-up table LUT.

The non-volatile memory 72 is a memory that retains information storage even when power is not supplied. For example, the non-volatile memory 72 is a memory that can rewrite information while retaining the information storage even when the power is not supplied. The non-volatile memory 72 stores various kinds of information required for an operation and the like of the circuit device 20. The non-volatile memory 72 can be implemented by, for example, an electrically erasable programmable read-only memory (EEPROM) that is implemented by a floating gate avalanche injection MOS memory (FAMOS memory) or a metal-oxide-nitride-oxide-silicon memory (MONOS memory).

In FIG. 3, the non-volatile memory 72 stores the look-up table LUT and the correction data DCT. The temperature compensation circuit 60 performs the temperature compensation process described above using the look-up table LUT. The temperature compensation circuit 60 may load the information of the look-up table LUT into a storage circuit such as a register, and perform the temperature compensation process based on the information loaded into the storage circuit. The non-volatile memory 72 corresponding to the memory 70 in FIG. 1 stores the correction data DCT. Then, the interface circuit 80 outputs, in addition to the temperature detection data DTD from the temperature sensor circuit 40, the correction data DCT stored in the non-volatile memory 72 to the outside. Controlling to read the correction data DCT from the non-volatile memory 72 is performed by, for example, the logic circuit 50.

In this way, in FIG. 3, the memory 70 in FIG. 1 is implemented by the non-volatile memory 72, and the correction data DCT is stored in the non-volatile memory 72. In this way, the correction data DCT for correcting the temperature detection data DTD to obtain a temperature is stored in advanced in the non-volatile memory 72, the correction data DCT can be read from the non-volatile memory 72, and the correction data DCT can be output together with the temperature detection data DTD to the outside by the interface circuit 80.

The interface circuit 80 outputs a data signal DA to a first pad PDA. The data signal DA is output to the outside via a first terminal TDA of the oscillator 4. For example, the interface circuit 80 outputs the temperature detection data DTD and the correction data DCT as the data signal DA. The data signal DA from the outside is also input to the interface circuit 80.

The output circuit 90 outputs the clock signal CK generated based on the oscillation signal OSC. For example, the output circuit 90 buffers the oscillation signal OSC that is an oscillation clock signal from the oscillation circuit 30, and outputs the buffered oscillation signal OSC as the clock signal CK to a clock output pad PCK. Then, the clock signal CK is output to the outside via a clock output terminal TCK of the oscillator 4. For example, the output circuit 90 outputs the clock signal CK in a single-ended CMOS signal format. The output circuit 90 may output the clock signal CK in a signal format other than the CMOS. A clock signal generation circuit such as a PLL circuit that generates the clock signal CK with a frequency obtained by multiplying the frequency of the oscillation signal OSC may be provided at a later stage of the oscillation circuit 30. Then, the output circuit 90 may buffer the clock signal CK generated by the clock signal generation circuit and output the buffered clock signal CK.

The first pad PDA coupled to the interface circuit 80 and the first terminal TDA of the oscillator 4 coupled to the first pad PDA can also be used as an output enable pad and an output enable terminal. For example, when the first pad PDA is used as the output enable pad and the first pad PDA and the first terminal TDA are set to an active level such as a high level, the output circuit 90 outputs the clock signal CK to the outside. On the other hand, when the first pad PDA and the first terminal TDA are set to an inactive level such as a low level, the output circuit 90 sets, for example, the clock signal CK to a fixed voltage level such as a low level.

The power supply circuit 96 is supplied with a power supply voltage VDD from a power supply pad PVDD and a ground voltage GND from a ground pad PGND, and supplies various power supply voltages for an internal circuit of the circuit device 20 to the internal circuit. For example, the power supply circuit 96 supplies a regulated power supply voltage obtained by regulating the power supply voltage VDD to each circuit of the circuit device 20, such as the oscillation circuit 30.

The power supply pad PVDD is a pad to which the power supply voltage VDD is supplied. The pad is a terminal of the circuit device 20 that is a semiconductor chip. For example, in a pad region, a metal layer is exposed from a passivation film that is an insulating layer, and the exposed metal layer forms the pad that is the terminal of the circuit device 20. For example, the power supply voltage VDD from an external power supply device is supplied to the power supply pad PVDD. The ground pad PGND is a terminal to which GND that is a ground voltage is supplied. GND may be referred to as VSS, and the ground voltage is, for example, a ground potential. In the present embodiment, the ground voltage is appropriately described as GND. The power supply pad PVDD, the ground pad PGND, the clock output pad PCK, and the first pad PDA are respectively electrically coupled to a power supply terminal TVDD, a ground terminal TGND, the clock output terminal TCK, and the first terminal TDA that are external terminals for externally coupling of the oscillator 4. For example, each pad is electrically coupled to a corresponding terminal using an internal wiring of the package, a bonding wire, a metal bump, or the like.

FIG. 4 shows another detailed configuration example of the circuit device 20 according to the present embodiment. The temperature sensor circuit 40 includes the ring oscillator 42, a counter control unit 46, and the counter 44. The ring oscillator 42 is a circuit obtained by coupling a plurality of delay elements in a ring shape. Specifically, the ring oscillator 42 is, for example, a circuit obtained by coupling an odd number of signal inverting circuits, such as inverter circuits, in a ring shape, and outputs an output pulse signal that is an oscillation signal. The counter 44 performs a process of counting a pulse number of the output pulse signal of the ring oscillator 42 using the clock signal generated based on the oscillation signal OSC, and outputs the temperature detection data DTD obtained based on a count value obtained by the counting process. The counter control unit 46 controls the counter 44. For example, the counter 44 obtains the count value of the pulse number of the output pulse signal in a counting period defined according to the clock signal, whereby the temperature detection data DTD is obtained.

A calculation circuit 61 performs a calculation process of adjusting temperature sensitivity of the temperature detection data DTD, and outputs, to the look-up table LUT, the temperature detection data DTD subjected to the calculation process. The temperature sensitivity of the temperature detection data DTD is a degree of a change in temperature detection data DTD with respect to a change in temperature. The calculation process performed by the calculation circuit 61 will be described in detail in FIGS. 11 and 12 to be described later. The temperature detection data DTD from the temperature sensor circuit 40 may be directly input to the look-up table LUT without providing the calculation circuit 61.

The non-volatile memory 72 corresponding to the memory 70 in FIG. 1 stores the look-up table LUT in which the temperature detection data DTD is associated with frequency adjustment data DFC. For example, in the look-up table LUT, each value of the frequency adjustment data DFC is associated with a corresponding value of the temperature detection data DTD. For example, the temperature detection data DTD is data that monotonically increases or monotonically decreases with respect to the temperature. As shown in FIG. 4, the calculation circuit 61 is provided, which performs the calculation process of adjusting the temperature sensitivity of the temperature detection data DTD. That is, a calculation process of adjusting the degree of the change in temperature detection data DTD with respect to the change in temperature is performed. Accordingly, in the temperature detection data DTD after the calculation process, a slope of the change in temperature detection data DTD with respect to the change in temperature varies depending on a temperature range.

The temperature compensation circuit 60 outputs the frequency adjustment data DFC corresponding to the temperature detection data DTD with reference to the look-up table LUT. For example, the temperature compensation circuit 60 reads the frequency adjustment data DFC corresponding to the temperature detection data DTD from the look-up table LUT, and outputs the frequency adjustment data DFC to the variable capacitance circuit 32 that is a frequency adjustment circuit of the oscillation circuit 30. In this way, the capacitance of the variable capacitance circuit 32 is adjusted by using the frequency adjustment data DFC generated based on the temperature detection data DTD, whereby the oscillation frequency of the oscillation circuit 30 is adjusted, and the temperature compensation process on the oscillation frequency is performed.

In FIG. 4, the circuit device 20 includes the calculation circuit 61 that performs the calculation process of adjusting the temperature sensitivity and that outputs, to the look-up table LUT, the temperature detection data DTD subjected to the calculation process. For example, the calculation circuit 61 performs, as the calculation process of adjusting the temperature sensitivity, a conversion process of causing a slope of the temperature detection data DTD with respect to the temperature in a first temperature range to be different from a slope of the temperature detection data DTD with respect to the temperature in a second temperature range. When such a calculation circuit 61 that performs the calculation process of adjusting the temperature sensitivity is provided, the calculation process of appropriately adjusting the temperature sensitivity is performed and the temperature detection data DTD after the calculation process can be output to the look-up table LUT even when the temperature sensitivity varies depending on the temperature range.

In FIG. 4, the temperature detection data DTD after the calculation process performed by the calculation circuit 61 is output to the outside via the interface circuit 80. In this way, by outputting the temperature detection data DTD after the calculation process, the temperature detection data DTD having a reduced individual difference variation can be output as compared with a case in which the temperature detection data DTD before the calculation process is output. However, the present embodiment is not limited thereto, and the temperature detection data DTD before the calculation process performed by the calculation circuit 61 may be output to the outside via the interface circuit 80.

As shown in FIG. 4, the circuit device 20 includes the interruption signal generation circuit 62 that generates an interruption signal INT. The interruption signal generation circuit 62 generates the interruption signal INT when the temperature detection data DTD is greater than an upper limit value UL or smaller than a lower limit value LL. The upper limit value UL and the lower limit value LL may be written by the external processing device 100 via, for example, the interface circuit 80, or may be stored in the memory 70 such as the non-volatile memory 72. The generated interruption signal INT is output to the external processing device 100 or the like via, for example, the interface circuit 80. It is possible to notify, by providing such an interruption signal generation circuit 62, the external processing device 100 or the like that the temperature corresponding to the temperature detection data DTD is greater than an upper limit temperature or smaller than a lower limit temperature. Accordingly, the external processing device 100 or the like can execute an interruption process corresponding to the interruption signal INT.

As shown in FIG. 4, the interruption signal generation circuit 62 includes, for example, a first register 63, a second register 64, and a comparison circuit 65. The first register 63 stores the upper limit value UL, and the second register 64 stores the lower limit value LL. The comparison circuit 65 compares the temperature detection data DTD with the upper limit value UL or the lower limit value LL to generate the interruption signal INT. The first register 63 and the second register 64 can be implemented by, for example, a storage circuit such as a flip-flop circuit. The external processing device 100 may write the upper limit value UL and the lower limit value LL in the first register 63 and the second register 64 via, for example, the interface circuit 80. Alternatively, the memory 70 such as the non-volatile memory 72 may store the upper limit value UL and the lower limit value LL, and the upper limit value UL and the lower limit value LL may be loaded from the memory 70 into the first register 63 and the second register 64. The comparison circuit 65 includes comparators 66 and 67 and an OR circuit 68. The comparator 66 compares a value of the temperature detection data DTD with the upper limit value UL, and outputs a first comparison signal that reaches an active level when the value of the temperature detection data DTD is greater than the upper limit value UL. The comparator 67 compares the value of the temperature detection data DTD with the lower limit value LL, and outputs a second comparison signal that reaches an active level when the value of the temperature detection data DTD is smaller than the lower limit value LL. The OR circuit 68 outputs the interruption signal INT that reaches an active level when either the first comparison signal from the comparator 66 or the second comparison signal from the comparator 67 reaches an active level. The interruption signal INT is output to the outside via, for example, the interface circuit 80.

According to the interruption signal generation circuit 62 having such a configuration, the upper limit value UL and the lower limit value LL are stored in advance in the first register 63 and the second register 64, and the interruption signal INT can be generated by comparing the upper limit value UL and the lower limit value LL with the temperature detection data DTD. Then, it is possible to notify, by using such an interruption signal INT, the external processing device 100 or the like that the temperature corresponding to the temperature detection data DTD is greater than the upper limit temperature or smaller than the lower limit temperature.

In the present embodiment, the memory 70 such as the non-volatile memory 72 may store the upper limit value UL and the lower limit value LL. For example, in the case of producing or inspecting the circuit device 20 and the oscillator 4, the external device writes the upper limit value UL and the lower limit value LL calculated based on the correction data DCT into the memory 70 via the interface circuit 80. In this way, the upper limit value UL and the lower limit value LL in which the individual difference variation is corrected based on the correction data DCT can be written and stored in the memory 70. During a normal operation of the circuit device 20 and the oscillator 4, the upper limit value UL and the lower limit value LL are loaded from the memory 70 into the first register 63 and the second register 64, and the interruption signal generation circuit 62 compares the loaded upper limit value UL and lower limit value LL with the temperature detection data DTD to generate the interruption signal INT. In this way, the interruption signal generation circuit 62 can output to the outside an appropriate interruption signal INT generated by comparing the temperature detection data DTD with the upper limit value UL and the lower limit value LL in which the individual difference variation is corrected.

Also in the circuit device 20 in FIGS. 3 and 4 described above, the temperature sensor circuit 40 outputs the temperature detection data DTD, and the non-volatile memory 72 that is the memory 70 stores the correction data DCT. Then, the interface circuit 80 outputs the temperature detection data DTD and the correction data DCT to the outside. In this way, for example, the external processing device 100 in FIG. 13 can detect an accurate temperature by performing the calculation process of correcting the temperature detection data DTD based on the correction data DCT.

Figure 5:
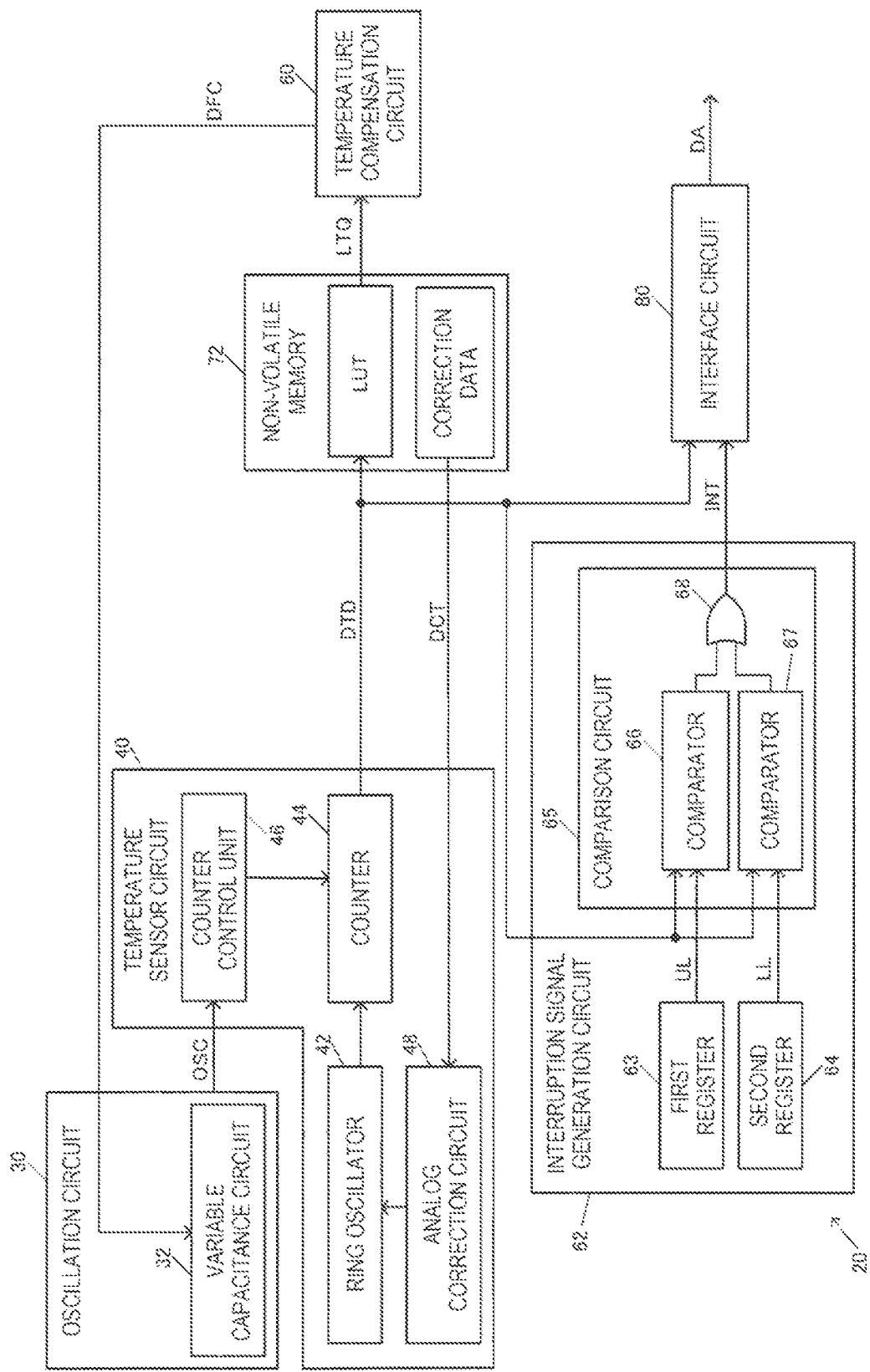
FIG. 5 is a configuration example of a comparative example according to the present embodiment.
Figure 6:
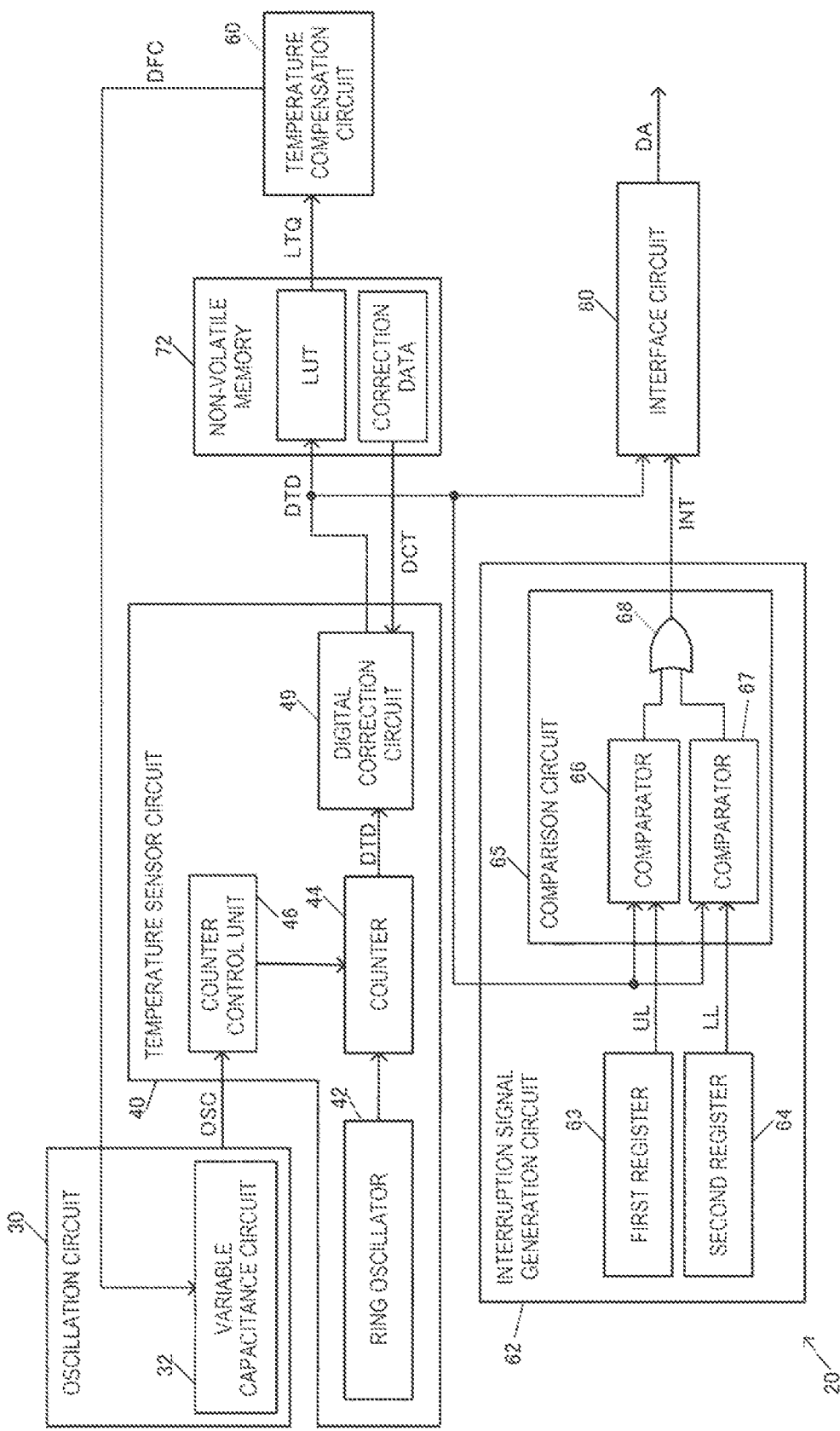
FIG. 6 is a configuration example of a comparative example according to the present embodiment.

For example, FIGS. 5 and 6 show configuration examples of comparative examples according to the present embodiment. In FIG. 5, an analog correction circuit 48 is provided in the temperature sensor circuit 40, and the analog correction circuit 48 corrects the temperature detection data DTD by, for example, correcting a current or the like flowing through transistors constituting the delay elements of the ring oscillator 42. That is, the analog correction circuit 48 corrects the individual difference variation of the properties of the temperature detection data DTD with respect to the temperature described in FIG. 2. Then, the interface circuit 80 outputs the temperature detection data DTD subjected to such correction to the outside. In FIG. 6, a digital correction circuit 49 is provided in the temperature sensor circuit 40, and the digital correction circuit 49 corrects the individual difference variation of the properties of the temperature detection data DTD with respect to the temperature by performing digital correction on the temperature detection data DTD output from the counter 44.

As shown in FIGS. 5 and 6, in the comparative examples in which the correction is performed by the analog correction circuit 48 or the digital correction circuit 49, power consumption of the circuit device 20 increases due to power consumption in the analog correction circuit 48 or the digital correction circuit 49. When the analog correction circuit 48 or the digital correction circuit 49 is provided, a circuit layout area of the circuit device 20 increases, causing an increase in cost. In the correction performed by the analog correction circuit 48 in FIG. 5, there is also a problem that temperature measurement accuracy is reduced since accuracy of the correction of the individual difference variation is not high.

For example, in the circuit device 20 that performs the temperature compensation process using the look-up table LUT, correction of a temperature detection variation performed by the analog correction circuit 48 or the digital correction circuit 49 is originally not required. It is because both the temperature detection variation of the temperature sensor circuit 40 and a temperature property variation of the resonator 10 are corrected using the look-up table LUT in the circuit device 20 having such a configuration. However, in the oscillator 4 such as RTC, the circuit device 20 cannot predict a timing at which the temperature detection data DTD is read by the external processing device 100. In addition, when an event occurs in which the temperature detected according to the temperature detection data DTD is greater than the upper limit temperature or smaller than the lower limit temperature, the circuit device 20 cannot predict the timing when the event occurs even when an interruption occurs. Therefore, the correction of the temperature detection variation performed by the analog correction circuit 48 or the digital correction circuit 49, which is originally not required, is required in the comparative examples in FIGS. 5 and 6, and there is a problem that power is wastefully consumed in these circuits.

In this regard, according to the circuit device 20 of the present embodiment in FIGS. 1, 3, and 4, for example, the temperature detection data DTD from the temperature sensor circuit 40 is output from the interface circuit 80 without performing the correction of the temperature detection variation. The correction data DCT for correcting the temperature detection data DTD to obtain a temperature is stored in advance in the memory 70 such as the non-volatile memory 72, and the temperature detection data DTD not subjected to the correction of the temperature detection variation and the correction data DCT from the memory 70 are output to the outside via the interface circuit 80. Accordingly, the external processing device 100 that reads the temperature detection data DTD and the correction data DCT from the circuit device 20 can detect an accurate temperature by correcting the temperature detection data DTD based on the correction data DCT. Since the correction process for the temperature detection is performed only a required minimum number of times in the entire system, power consumption in the entire system can be reduced. According to the present embodiment, the analog correction circuit 48 and the digital correction circuit 49 as shown in FIGS. 5 and 6 are not required to be provided in the circuit device 20. Accordingly, problems that the power is wastefully consumed due to the correction performed by the analog correction circuit 48 or the digital correction circuit 49, a circuit scale increases due to these circuits, and the cost increases can also be resolved. The external processing device 100 that corrects the temperature detection data DTD based on the correction data DCT is implemented by, for example, a micro controller unit (MCU). Since MCU includes a calculator, there is also an advantage that the temperature detection can be performed by correcting the temperature detection data DTD based on the correction data DCT without adding a hardware resource.

Figure 7:
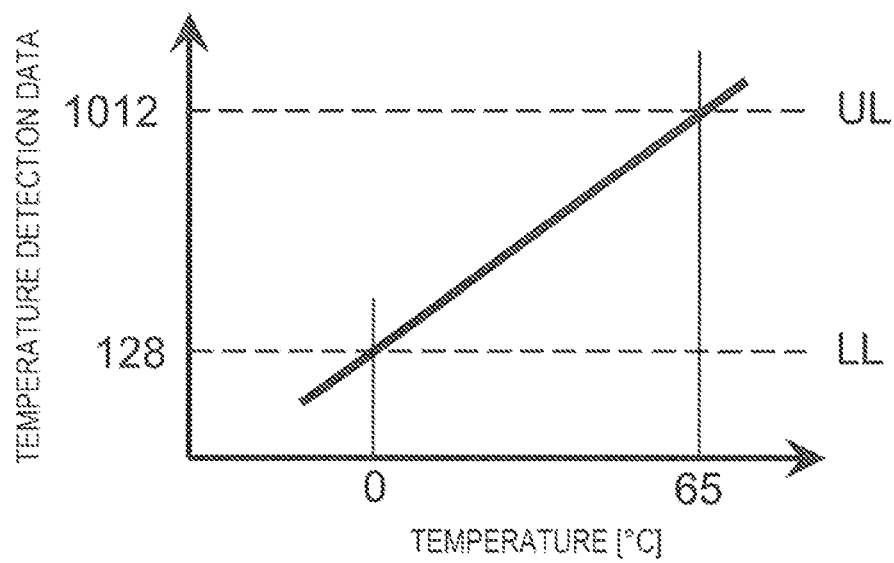
FIG. 7 is a diagram illustrating setting of an upper limit value and a lower limit value in the comparative example.
Figure 8:
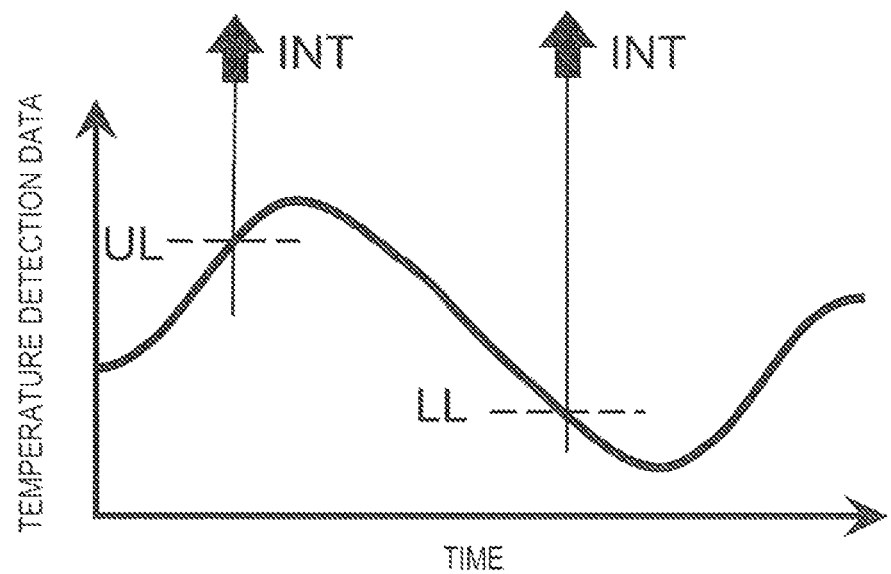
FIG. 8 is a diagram illustrating generation of an interruption signal in the comparative example.

FIGS. 7 and 8 are diagrams illustrating setting of the upper limit value UL and the lower limit value LL and generation of the interruption signal INT in the comparative examples in FIGS. 5 and 6. As shown in FIG. 7, in the comparative example, the upper limit value UL and the lower limit value LL are fixed values. In FIG. 7, for example, the upper limit value UL corresponding to 65° C. is set to a fixed value of 1012, and the lower limit value LL corresponding to 0° C. is set to a fixed value of 128. As shown in FIG. 8, when the temperature is higher than 65° C. that is the upper limit temperature and the value of the temperature detection data DTD is greater than UL=1012 that is the upper limit value, the interruption signal INT is generated. When the temperature is lower than 0° C. that is the lower limit temperature and the value of the temperature detection data DTD is smaller than LL=128 that is the lower limit value, the interruption signal INT is generated. In this way, in the comparative examples in FIGS. 5 and 6, since the upper limit value UL and the lower limit value LL are fixed values, the temperature detection data DTD is corrected by the analog correction circuit 48 or the digital correction circuit 49 every time the temperature is measured. Therefore, the power is wastefully consumed every time the temperature is measured.

Figure 9:
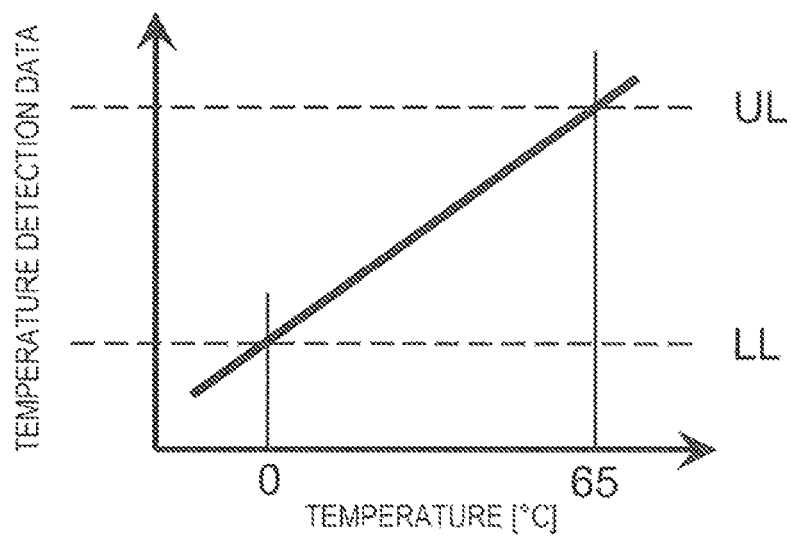
FIG. 9 is a diagram illustrating setting of an upper limit value and a lower limit value in the present embodiment.
Figure 10:
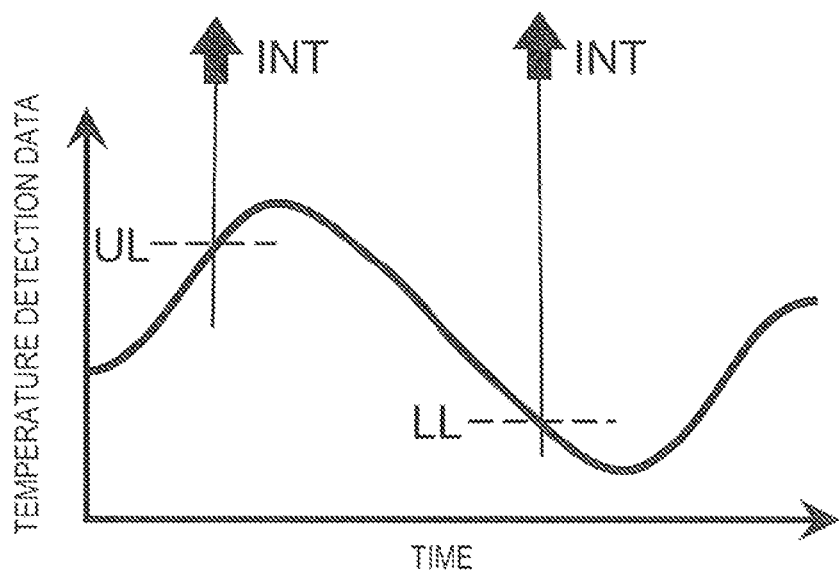
FIG. 10 is a diagram illustrating generation of an interruption signal in the present embodiment.

FIGS. 9 and 10 are diagrams illustrating setting of the upper limit value UL and the lower limit value LL and generation of the interruption signal INT according to the present embodiment. As shown in FIG. 9, in the present embodiment, the upper limit value UL and the lower limit value LL are not fixed values and are calculated based on the correction data DCT. For example, during an actual operation of the circuit device 20, the external processing device 100 calculates the upper limit value UL and the lower limit value LL based on the correction data DCT, and writes the upper limit value UL and the lower limit value LL into the first register 63 and the second register 64. Alternatively, in the case of producing or inspecting the circuit device 20 and the oscillator 4, the external device may calculate the upper limit value UL and the lower limit value LL, write the upper limit value UL and the lower limit value LL into the memory 70, and load the upper limit value UL and the lower limit value LL from the memory 70 to the first register 63 and the second register 64 during the actual operation. As shown in FIG. 10, when the temperature is higher than 65° C. that is the upper limit temperature and the value of the temperature detection data DTD is greater than the upper limit value UL, the interruption signal INT is generated. When the temperature is lower than 0° C. that is the lower limit temperature and the value of the temperature detection data DTD is smaller than the lower limit value LL, the interruption signal INT is generated. In this case, in the present embodiment, since it is not required to provide the analog correction circuit 48 or the digital correction circuit 49, a situation in which the power is wastefully consumed in these circuits can be prevented.

3. Calculation Circuit

Next, the details of the calculation process of the calculation circuit 61 in FIG. 4 will be described. FIG. 11 shows a relation between the temperature property of the oscillation frequency and an address assignment when the temperature detection data DTD output from the temperature sensor circuit 40 is used as it is as an address in the look-up table LUT. Here, an example in which the temperature detection data DTD is linear with respect to the temperature is shown, and the temperature detection data DTD may be substantially linear with respect to the temperature. An example in which the temperature property of the oscillation frequency is in a quadratic function with respect to the temperature is shown, and the temperature property may be a temperature property in which the temperature sensitivity of the oscillation frequency changes depending on the temperature.

Figure 11:
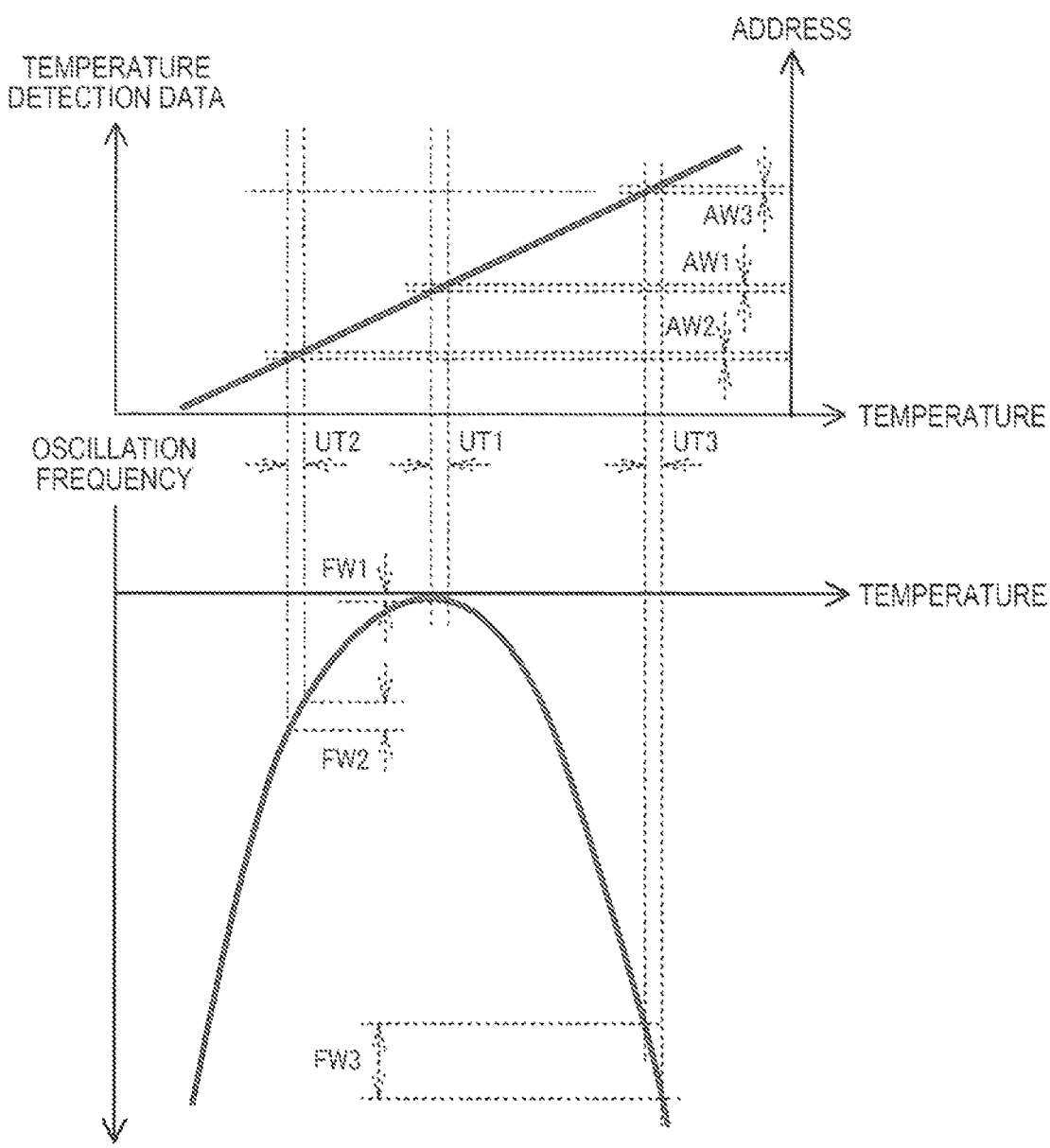
FIG. 11 is a diagram illustrating a calculation process of a calculation circuit.

The temperature property shown in FIG. 11 is a property in a quadratic function that is convex upward with the vicinity of room temperature as an apex. UT1 to UT3 are temperature ranges having a unit temperature width. The temperature range UT1 is in the vicinity of room temperature, and a frequency change amount FW1 per unit temperature is small. The temperature range UT2 is slightly apart from room temperature, and a frequency change amount FW2 per unit temperature is medium. The temperature range UT3 is further apart from room temperature than the temperature range UT2, and a frequency change amount FW3 per unit temperature is large. The frequency change amount per unit temperature corresponds to the temperature sensitivity of the oscillation frequency, and means that as the temperature range is apart from room temperature, the temperature sensitivity becomes high. The temperature sensitivity of the oscillation frequency is a degree of change in oscillation frequency with respect to a change in temperature.

The temperature ranges UT1 to UT3 having the unit temperature width correspond to address ranges AW1 to AW3 in the look-up table LUT, and the frequency change amounts FW1 to FW3 per unit temperature are assigned to the address ranges AW1 to AW3. Since the temperature detection data DTD is linear, the number of addresses included in each of the address ranges AW1 to AW3 is the same, and therefore, a frequency change amount per address is small in the temperature range UT1 and is large in the temperature range UT3.

In order to implement high-accurate temperature compensation while efficiently using the memory 70 having a finite capacity, it is desirable that the frequency change amount per address amount is uniform, but as described above, the address is excessively assigned in the temperature range UT1, and the address is insufficiently assigned in the temperature range UT3. For example, when the number of addresses per unit temperature is reduced, the assignment in the temperature range UT1 can be optimized, but since the frequency change amount per address is large in the temperature range UT3, accuracy of the temperature compensation is reduced. On the other hand, when the number of addresses per unit temperature increases, the accuracy of the temperature compensation in the temperature range UT3 can be improved, but since the assignment of the addresses increases regardless of a small frequency change in the temperature range UT1, use efficiency of the memory 70 is reduced. In this way, when the temperature detection data DTD output from the temperature sensor circuit 40 is used as it is as an address in the look-up table LUT, it is difficult to implement the high-accurate temperature compensation while efficiently using the memory 70 having a finite capacity, such as the non-volatile memory 72.

Figure 12:
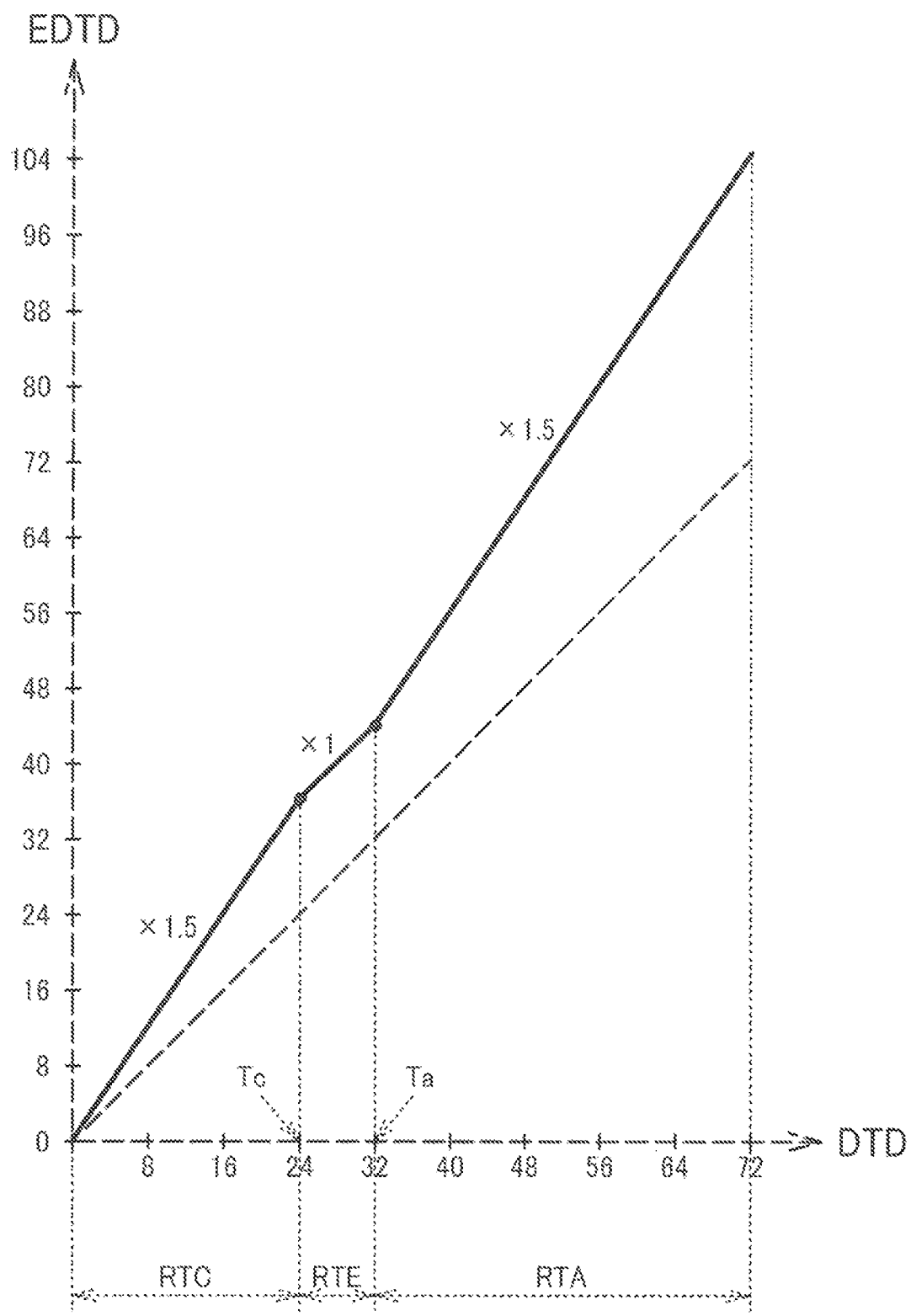
FIG. 12 is another diagram illustrating the calculation process of the calculation circuit.

FIG. 12 is a diagram showing an example of converting the temperature detection data DTD by the calculation process performed by the calculation circuit 61. The calculation circuit 61 converts the temperature detection data DTD by the calculation process of adjusting the temperature sensitivity of the temperature detection data DTD. Here, for ease of understanding the description, the temperature detection data before the conversion by the calculation circuit 61 is described as DTD, and the converted temperature detection data that is the temperature detection data after the conversion by the calculation circuit 61 is described as EDTD. In FIG. 12, a solid line indicates the converted temperature detection data EDTD, and a dotted line indicates a case in which the temperature detection data DTD is used as it is as the converted temperature detection data EDTD. In FIG. 12, the temperature detection data DTD and the converted temperature detection data EDTD are represented by decimal numbers. EDTD [n: i+1] that is an upper bit of the converted temperature detection data EDTD is indicated as an integer, and one integer value corresponds to one address.

In FIG. 12, larger a value of the temperature detection data DTD corresponds to a high temperature, and a range of 0 to 72 of the temperature detection data DTD corresponds to the operation temperature range of the circuit device 20. Here, the operation temperature range is divided into a temperature range RTC corresponding to a range of 0 to 24 of the temperature detection data DTD, a temperature range RTE corresponding to a range of 24 to 32 of the temperature detection data DTD, and a temperature range RTA corresponding to a range of 32 to 72 of the temperature detection data DTD. The temperature range RTE is in the vicinity of room temperature, and is a temperature range within which the temperature sensitivity of the oscillation frequency is low in the temperature property of the oscillation frequency as described in FIG. 11. The temperature ranges RTC and RTA are temperature ranges within which the temperature sensitivity of the oscillation frequency is higher than that at room temperature in the temperature property of the oscillation frequency.

The calculation circuit 61 does not change the slope of the temperature detection data DTD corresponding to the temperature range RTE in the vicinity of room temperature, and outputs the converted temperature detection data EDTD by performing an offset addition process on the temperature detection data DTD. The calculation circuit 61 outputs the converted temperature detection data EDTD by multiplying the slope of the temperature detection data DTD corresponding to the temperature ranges RTC and RTA, within which the temperature sensitivity of the oscillation frequency is high, by 1.5 and performing the offset addition process. An offset value added in the offset addition process is set such that a lower limit of the converted temperature detection data EDTD in the operation temperature range does not become negative. The offset value is set such that the lower limit of the converted temperature detection data EDTD is 0 in FIG. 12, or the offset value may be set such that the lower limit of the converted temperature detection data EDTD is larger than 0.

In this way, the calculation circuit 61 performs the calculation process of adjusting the temperature sensitivity of the temperature detection data DTD. For example, in the temperature ranges RTC and RTA in FIG. 12, the calculation process of adjusting the temperature sensitivity of the temperature detection data DTD is performed such that the slope of the temperature detection data DTD becomes large. Accordingly, in the temperature ranges RTC and RTA within which the temperature sensitivity of the oscillation frequency is high, the temperature sensitivity can be adjusted to temperature sensitivity with which the temperature detection data DTD is higher. That is, according to the present embodiment, the conversion process of the temperature detection data DTD is performed such that the slope of the temperature detection data DTD varies depending on the temperature range. Accordingly, the slope of the temperature detection data DTD can be adjusted depending on the temperature sensitivity in the temperature property of the oscillation frequency. Specifically, an absolute value of the slope of the temperature detection data DTD can be increased in the temperature range within which the temperature sensitivity is high, and the absolute value of the slope of the temperature detection data DTD can be decreased in the temperature range within which the temperature sensitivity is low. Since the address in the look-up table LUT is specified according to the temperature detection data DTD, a large absolute value of the slope of the temperature detection data DTD indicates a large number of addresses per unit temperature. Accordingly, since the address assignment per unit temperature is large in the temperature range within which the temperature sensitivity is high and the address assignment per unit temperature is small in the temperature range within which the temperature sensitivity is low, the high-accurate temperature compensation can be implemented while efficiently using the memory 70 having a finite capacity.

4. Interface Circuit and Processing System

Next, detailed examples of the interface circuit 80 and a processing system 200 according to the present embodiment will be described. As shown in FIG. 13, the processing system 200 according to the present embodiment includes the oscillator 4 and the processing device 100 electrically coupled to the oscillator 4. For example, the oscillator 4 is electrically coupled to the processing device 100 via a wiring or the like of a circuit board. The processing system 200 is incorporated in, for example, electronic equipment. The electronic equipment is, for example, network-related equipment such as a base station or a router, high-accurate measurement equipment that measures a physical quantity such as a distance, a time, a flow velocity, or a flow rate, a biological information measurement equipment that measures biological information, or in-vehicle equipment. The electronic equipment may be mesh network equipment of a sensor, internet of things (IoT) equipment, wearable equipment such as a head mounted display device or watch-related equipment, a robot, a printing device, a projection device, a portable information terminal such as a smartphone, a content providing equipment that distributes contents, or video equipment such as a digital camera or a video camera.

The processing device 100 can be implemented by, for example, a processor such as a microprocessor unit (MPU), a micro controller unit (MCU), or a central processing unit (CPU), or a circuit device such as an application specific integrated circuit (ASIC). For example, the processing device 100 that is an external device may include the circuit device, a circuit board on which the circuit device is mounted, and the like. The processing device 100 detects a temperature by performing the calculation process of correcting the temperature detection data DTD based on the correction data DCT. That is, as shown in FIGS. 1 and 3, the interface circuit 80 of the circuit device 20 transmits the temperature detection data DTD and the correction data DCT as the data signal DA, and the external processing device 100 receives the temperature detection data DTD and the correction data DCT. Specifically, the processing device 100 includes an interface circuit 110, and the interface circuit 110 receives the temperature detection data DTD and the correction data DCT. Then, the processing device 100 detects a temperature corresponding to the temperature detection data DTD by performing the calculation process of correcting the temperature detection data DTD based on the correction data DCT. The calculation process of correcting the temperature detection data DTD can be executed by, for example, a program running on a processor of the processing device 100.

In this way, according to the processing system 200 in FIG. 13, a process of correcting the temperature detection data DTD based on the correction data DCT and detecting the temperature is performed in the external processing device 100, not in the circuit device 20. Therefore, the processing device 100 executes the process of correcting the temperature detection data DTD based on the correction data DCT and detecting the temperature at a timing at which the processing device 100 itself is required to detect the temperature. For example, in the comparative examples in FIGS. 5 and 6, the correction process for the temperature detection is constantly executed by the analog correction circuit 48 or the digital correction circuit 49, and since the correction process is executed even at a timing at which the temperature detection is not required, the power is wastefully consumed. In contrast, in FIG. 13, since the correction process for the temperature detection is performed only a required minimum number of times in the entire processing system 200, the power consumption of the entire processing system 200 can be reduced.

In FIG. 13, the circuit device 20 includes the clock output pad PCK, the output circuit 90 that outputs the clock signal CK generated based on the oscillation signal OSC to the external processing device 100 via the clock output pad PCK, and the first pad PDA. The clock output pad PCK is electrically coupled to the clock output terminal TCK of the oscillator 4, and the first pad PDA is electrically coupled to the first terminal TDA of the oscillator 4. The output circuit 90 outputs, as the clock signal CK generated based on the oscillation signal OSC, a signal obtained by buffering the oscillation signal OSC.

The PLL circuit that generates the clock signal CK with the frequency obtained by multiplying the frequency of the oscillation signal OSC from the oscillation circuit 30 may be provided, and the output circuit 90 may output the clock signal CK from the PLL circuit to the clock output pad PCK. In this case, the clock signal CK generated based on the oscillation signal OSC is a clock signal with a frequency obtained by multiplying the frequency of the oscillation signal OSC. For example, the PLL circuit includes a voltage-controlled oscillation circuit, compares a phase of the oscillation signal OSC that is a reference clock signal with a phase of a feedback clock signal, and outputs the clock signal CK with the frequency obtained by multiplying the frequency of the oscillation signal OSC. In this case, for example, a fractional-N type PLL circuit capable of fractionally multiplying a frequency may be used as the PLL circuit.

The interface circuit 80 performs communication with the processing device 100 based on the data signal DA. Specifically, the processing device 100 includes the interface circuit 110, and serial communication is performed based on the data signal DA between the interface circuit 110 that is a master and the interface circuit 80 that is a slave. For example, the processing device 100 includes a data terminal EDA to and from which the data signal DA is input and output, a clock input terminal ECK to which the clock signal CK is input, a power supply terminal EVDD to which VDD is supplied, and a ground terminal EGND to which GND is supplied. The interface circuit 110 of the processing device 100 performs the communication with the interface circuit 80 based on the clock signal CK input to the clock input terminal ECK and the data signal DA input and output by the data terminal EDA.

In the communication, the output circuit 90 outputs the clock signal CK to the processing device 100 that is the master of the communication. That is, normally, the master outputs a clock signal for communication, whereas in FIG. 13, the output circuit 90 on a slave side outputs the clock signal CK. Then, the interface circuit 80 that is the slave of the communication receives the data signal DA, which is transmitted from the processing device 100 and synchronized with the clock signal CK, via the first pad PDA. That is, the processing device 100 that is the master transmits the data signal DA in synchronization with the clock signal CK from the slave, and the interface circuit 80 that is the slave receives the transmitted data signal DA. Alternatively, the interface circuit 80 that is the slave of the communication transmits the data signal DA to the processing device 100 via the first pad PDA in synchronization with the clock signal CK. That is, the interface circuit 80 that is the slave transmits the data signal DA in synchronization with the clock signal CK, and processing device 100 that is the master receives the transmitted data signal DA. In this way, based on the clock signal CK output from the slave side, synchronous communication of the data signal DA is possible between the processing device 100 that is the master of the communication and the interface circuit 80 that is the slave of the communication.

In FIG. 13, a pull-up resistor RP is provided between a data line of the data signal DA and a power supply line of VDD. Accordingly, the data line coupling the processing device 100 and the interface circuit 80 is pulled up. That is, the data line is in a state of being pulled up to a power supply voltage level of VDD. In this way, when neither the interface circuit 80 nor the processing device 100 drives the data line to a low level, the data line is pulled up to a high level that is the power supply voltage level of VDD. Specifically, when the interface circuit 80 or the interface circuit 110 of the processing device 100 includes an I/O circuit 82 including an open-drain N-type transistor TR shown in FIG. 14 to be described later, the data line is pulled up to a high level when the transistor TR is turned off. Accordingly, serial data communication performed using the data line can be implemented.

In FIG. 13, the pull-up resistor RP is provided between the data line of the data signal DA and the power supply line of VDD, or such a pull-up resistor RP may not be provided.

The oscillator 4 shown in FIG. 13 is a four-terminal oscillator including the power supply terminal TVDD, the ground terminal TGND, the clock output terminal TCK, and the first terminal TDA. There is a problem regarding how to implement the communication with the external processing device 100 in the oscillator 4 having such a small number of terminals.

For example, as a method of a comparative example of FIG. 13, a method of setting an operation mode to a communication mode during production or inspection is considered, for example, a method of switching the clock output terminal TCK to a clock input terminal for communication and switching the first terminal TDA that is the output enable terminal to a data terminal for communication. The clock signal for communication from the processing device 100 that is the master is input to the clock output terminal TCK switched to the clock input terminal, and communication of the data signal DA is performed using the first terminal TDA switched to the data terminal for communication.

However, in the method of the comparative example, since the clock output terminal TCK is switched to the clock input terminal for communication, the clock signal CK generated based on the oscillation signal OSC of the oscillation circuit 30 cannot be output from the clock output terminal TCK. Therefore, when the processing device 100 that is the master operates based on the clock signal CK or there are other external devices that operate using the clock signal CK, the processing device 100 or the other external devices cannot operate based on the clock signal CK in the communication mode. That is, the output of the clock signal CK to the outside and the communication with the processing device 100 cannot be performed at the same time.

In this regard, according to the configuration in FIG. 13, the communication with the processing device 100 is performed using the clock signal CK output by the oscillator 4. That is, normally, the communication with the processing device 100 is performed using the clock signal for communication output by the master, but in FIG. 13, the communication with the processing device 100 is performed using the clock signal CK output by the oscillator 4 that is the slave. Therefore, unlike the method of the above comparative example, it is not required to set the operation mode to the communication mode and switch the clock output terminal TCK to the clock input terminal for communication. The communication with the processing device 100 using the clock signal CK and the data signal DA can be executed while outputting the clock signal CK from the clock output terminal TCK to the processing device 100 or the other external devices. Therefore, even when the number of terminals of the oscillator 4 is small, for example, four, the output of the clock signal CK from the clock output terminal TCK and the communication with the processing device 100 using the clock signal CK and the data signal DA can be performed at the same time.

Even when the number of terminals of the oscillator 4 is 5 or more and, for example, the clock input terminal for communication is provided in the oscillator 4, there is also a problem that noise due to the clock signal for communication input to the clock input terminal for communication adversely affects signal properties of the clock signal CK. That is, in this case, since the clock signal CK output from the oscillator 4 and the clock signal for communication from the processing device 100 are asynchronous, the noise due to the clock signal for communication is superimposed on the clock signal CK, and noise such as jitter noise is generated with respect to the clock signal CK.

Regarding the problem, according to the configuration in FIG. 13, the communication with the processing device 100 is performed using the clock signal CK output to the outside by the oscillator 4, instead of the clock signal for communication output by the processing device 100. That is, the clock signal CK output to the outside by the oscillator 4 is used as the clock signal for communication with the processing device 100. Therefore, as described above, the occurrence of the problem that the noise due to the clock signal for communication is superimposed on the clock signal CK and the properties of the clock signal deteriorate can be effectively prevented.

In FIG. 13, the output circuit 90 also outputs the clock signal CK in periods other than a communication period. For example, the output circuit 90 outputs the clock signal CK in the communication period, and also outputs the clock signal CK in the periods other than the communication period. In this way, the clock signal CK can be supplied to the processing device 100 and the other external devices even in the periods other than the communication period. Accordingly, the processing device 100 or the other external devices can operate using the clock signal CK as an operation clock signal, and can execute a predetermined process based on the clock signal CK.

For example, as an application example in FIG. 13, an example is considered in which the clock signal CK with 32 KHz from the oscillator 4 is supplied to a circuit of RTC of the processing device 100 such as a microcomputer, and a time counting process with a calendar is executed in RTC. In this case, since the time counting process with the calendar is required to be executed without stopping, the clock signal CK from the oscillator 4 is required to be constantly supplied to the circuit of the RTC of the processing device 100. On the other hand, the processing device 100 may, for example, detect an ambient temperature and perform a warning notification process when the temperature is greater than the upper limit or smaller than the lower limit, while performing such a time counting process with the calendar. In this case, the processing device 100 can execute the warning notification process by effectively using the temperature detection data DTD of the temperature sensor circuit 40 of the oscillator 4 and detecting the temperature based on the temperature detection data DTD output from the oscillator 4 via the interface circuit 80. In this case, according to the configuration in FIG. 13, the temperature detection data DTD from the oscillator 4 can be transmitted to the processing device 100 in the communication period, and the time counting process with the calendar can be executed by constantly supplying the clock signal CK of the oscillator 4 to the circuit of the RTC in the communication period and the periods other than the communication period. Therefore, the processing device 100 can execute the temperature detection performed based on the temperature detection data DTD and the time counting process with the calendar performed based on the clock signal CK at the same time.

Figure 14:
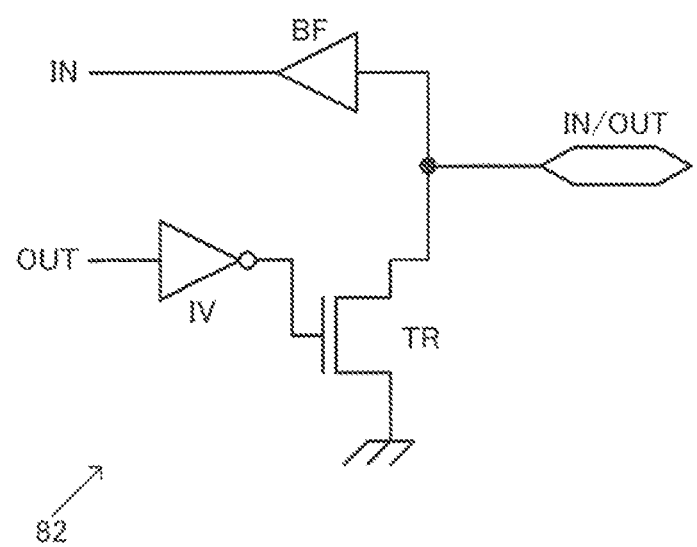
FIG. 14 is a configuration example of an I/O circuit of an interface circuit.

FIG. 14 is a configuration example of the I/O circuit 82 included in the interface circuit 80 or the interface circuit 110. The I/O circuit 82 includes an open-drain N-type transistor TR and an input buffer BF. An IN/OUT terminal in FIG. 14 corresponds to the first terminal TDA or the data terminal EDA in FIG. 13. The first terminal TDA corresponds to the data terminal of the oscillator 4.

An output signal OUT from an internal circuit is, for example, buffered by an inverter IV and input to a gate of the transistor TR. For example, when the output signal OUT reaches a low level and the gate of the transistor TR reaches a high level, the transistor TR is turned on and the data line is driven to a low level. On the other hand, when the output signal OUT reaches a high level and the gate of the transistor TR reaches a low level, the transistor TR is turned off. In this case, the data line is in a state of being pulled up to a high level by the resistor RP in FIG. 13. Accordingly, the data signal DA can be transmitted using the output signal OUT.

The IN/OUT terminal is coupled to the input buffer BF, and an input signal IN of the IN/OUT terminal is buffered by the input buffer BF and input into the internal circuit. Accordingly, the data signal DA can be received using the input signal IN.

When the pull-up resistor RP in FIG. 13 is not provided, the I/O circuit 82 in FIG. 14 may be provided with, for example, a push-pull output circuit including a P-type transistor and an N-type transistor provided in series between VDD and GND, instead of the open-drain N-type transistor TR.

Figure 15:
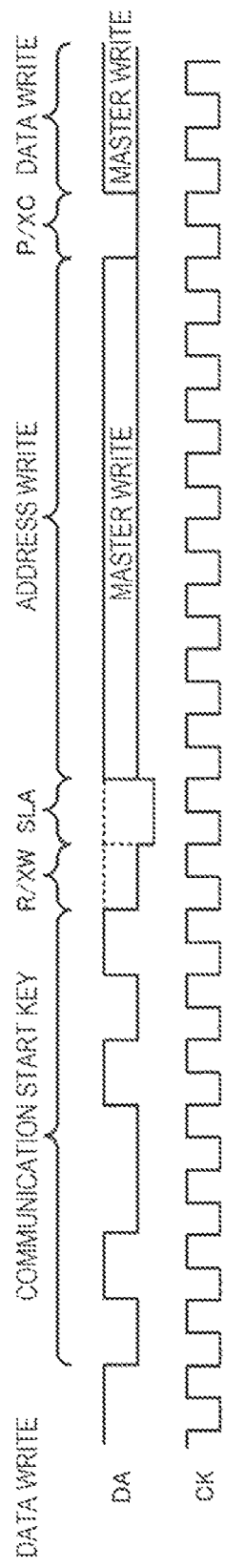
FIG. 15 is a signal waveform diagram illustrating a communication example according to the present embodiment.
Figure 16:
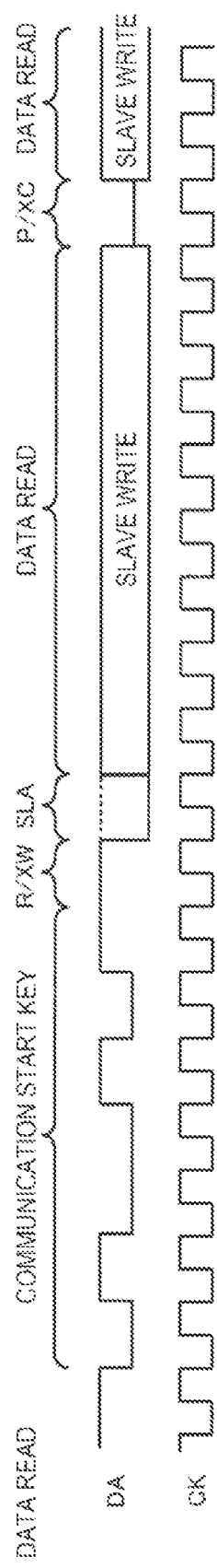
FIG. 16 is another signal waveform diagram illustrating the communication example according to the present embodiment.

FIGS. 15 and 16 are signal waveform diagrams illustrating communication examples according to the present embodiment. FIG. 15 is the signal waveform diagram in the case of data write in which the processing device 100 which is the master writes data in the oscillator 4. The data write by the master corresponds to the data reception by the interface circuit 80 of the oscillator 4 that is the slave. FIG. 16 is the signal waveform diagram in the case of data read in which the processing device 100 reads the data from the oscillator 4. The data read by the master corresponds to the data transmission by the interface circuit 80 of the oscillator 4 that is the slave. In FIGS. 15 and 16, in order to distinguish a case in which the master outputs a low level and a case in which the slave outputs a low level, the low level output by the slave is schematically shown as a potential lower than the low level output by the master.

In the data write in FIG. 15, the processing device 100 that is the master transmits a communication start key, and the interface circuit 80 that is the slave receives the communication start key. In this case, the processing device 100 that is the master transmits the communication start key in synchronization with the clock signal CK from the slave. Then, the interface circuit 80 that is the slave receives the communication start key synchronized with the clock signal CK, determines whether the received communication start key is a key with an appropriate code according to a protocol, and determines that the communication is started when the received communication start key is the key with the appropriate code. In this way, in the present embodiment, the interface circuit 80 starts the communication on a condition that the communication start key is received from the processing device 100. In this way, the communication between the master and the slave is started on a condition that the communication start key with the appropriate code is transmitted from the master to the slave, and appropriate communication between the master and the slave with the communication start key as a starting point can be started. In the present embodiment, the processing device 100 is appropriately and simply described as the master, and the interface circuit 80 is appropriately and simply described as the slave.

The master transmits the communication start key, and then outputs R/XW specifying whether the data is to be written or read. In R/XW, X means a negative logic, and the master outputs a high level when the data is to be read, and outputs a low level when the data is to be written. In FIG. 15, since the data is to be written, the master outputs a low level as XW of R/XW. That is, a low level is output by turning on the open-drain N-type transistor of the I/O circuit 82 on a master side in FIG. 14.

In this way, when the master outputs a low level after the communication start key is transmitted, the slave outputs SLA indicating an acknowledgment of the slave. Specifically, the slave outputs a low level as SLA. As described above, in order to distinguish the low level output by the slave from the low level output by the master, the low level output by the slave is schematically described as the low level having a low potential in FIG. 15.

When the slave outputs the low level as SLA in this way, the master writes an address for the slave. The address is an address that specifies a register of the slave to which the data is to be written. In the address write, the master transmits address information as the data signal DA, and the slave receives the address information.

The master outputs P/XC after the address write. P means stop for stopping the communication, and XC means continue for continuing the communication. X in XC means a negative logic. In FIG. 15, since the communication is continued, the master outputs a low level as XC of R/XC. Then, the master transmits, as the data signal DA, the data written in the address specified by the address write. Accordingly, the data from the master is written in a register with the specified address among registers of the oscillator 4.

In the case of the data read in FIG. 16, the master first transmits a communication start key, and the slave receives the communication start key. Then, in FIG. 16, since the data is to be read, the master outputs a high level as R of R/XW. Then, the slave outputs a low level as SLA that is an acknowledgment.

In this way, SLA is output by the slave, and then the data read is performed. As described later, in the case of the data read, an address of the data read is specified in advance. The data read in FIG. 16 is slave write in which the slave writes the data in the data line of the data signal DA. That is, the data read from the slave is written in the data line and transmitted to the master. When the master outputs a low level as XC of P/XC, which instructs to continue the communication, next data read is performed.

Figure 17:
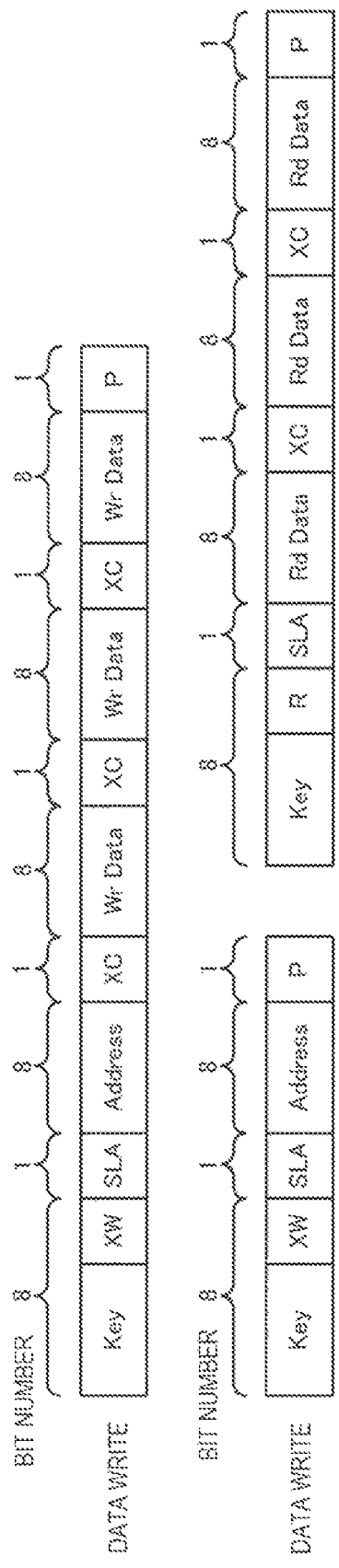
FIG. 17 is a diagram illustrating an example of a communication protocol according to the present embodiment.

FIG. 17 is a diagram illustrating an example of a communication protocol according to the present embodiment. In the data write in FIG. 17, the master outputs an 8-bit communication start key and XW, and then the slave outputs 1-bit SLA. Then, the master writes an 8-bit address and specifies a write address. Then, the master outputs 1-bit XC that instructs to continue the communication, and then transmits 8-bit data to the slave. Accordingly, in the slave, the data is written in the specified write address. Next, the master outputs XC that instructs to continue the communication, and then transmits next data. In this case, the write address is automatically updated in the slave, and the data from the master is written in next write address after the update. Thereafter, the master outputs XC that instructs to continue the communication, and then transmits next data and writes the next data into the slave. When there is no data to be written next time, the master outputs 1-bit P that instructs to stop the communication.

In the data read in FIG. 17, the master outputs an 8-bit communication start key and XW, and then the slave outputs 1-bit SLA. Then, the master writes an 8-bit address and specifies the address of the data read, and then outputs 1-bit P that instructs to stop the communication. Next, when the master outputs an 8-bit communication start key and R, and then the slave outputs 1-bit SLA, the master reads and receives the 8-bit data from the slave. The address of the data read in this case is the address specified before the data read as described above. Next, the master outputs XC that instructs to continue the communication, and then reads and receives next data from the slave. In this case, the address of the data read is automatically updated. When there is no data to be read next time, the master outputs 1-bit P that instructs to stop the communication.

In this way, in the present embodiment, in the data write in FIG. 17, after first data with a predetermined number of bits is received, the interface circuit 80 determines that the communication is to be continued when the processing device 100 outputs a low level, and receives next second data with the predetermined number of bits. That is, in the data write performed by the master in FIG. 17, the interface circuit 80 that is the slave receives the first data with 8 bits that is the predetermined number of bits. Specifically, the first data transmitted by the master is received and written in the register. The predetermined number of bits is not limited to 8 bits, and may be 16 bits, 32 bits, or the like. When the processing device 100 outputs, after the first data is transmitted, a low level as XC that instructs to continue the communication, the interface circuit 80 determines that the communication is to be continued. When the processing device 100 transmits the second data after a low level is output as XC, the interface circuit 80 receives the transmitted second data, and the received second data is written in the register. In this way, after the first data is received, the interface circuit 80 can determine whether the communication is to be continued by detecting whether the processing device 100 outputs a low level, and can receive the next second data. Accordingly, the interface circuit 80 can continuously receive a plurality of pieces of data with a predetermined number of bits, such as the first data and the second data. When the processing device 100 does not output a low level after the first data is received, as shown in FIG. 13, since the data line is pulled up by the resistor RP and is set to a high level, the interface circuit 80 can determine that the communication is not to be continued and stop the communication.

In the present embodiment, in the data read in FIG. 17, after the first data with the predetermined number of bits is transmitted, the interface circuit 80 determines that the communication is to be continued when the processing device 100 outputs a low level, and transmits the next second data with the predetermined number of bits. That is, in the data read performed by the master in FIG. 17, the interface circuit 80 that is the slave transmits the first data with 8 bits that is the predetermined number of bits. There-
after, when the processing device 100 outputs a low level as XC that instructs to continue the communication, the interface circuit 80 determines that the communication is to be continued, and transmits the next second data. In this way, after the first data is transmitted, the interface circuit 80 can determine whether the communication is to be continued by detecting whether the processing device 100 outputs a low level, and can transmit the next second data. Accordingly, the interface circuit 80 can continuously transmit a plurality of pieces of data with a predetermined number of bits, such as the first data and the second data. When the processing device 100 does not output a low level after the first data is transmitted by the interface circuit 80, since the data line is pulled up by the resistor RP and is set to a high level, the interface circuit 80 can determine that the communication is not to be continued and stop the communication.

In FIGS. 15 to 17, communication is performed in which a low level is reached when the logic level is "0" and a high level is reached when the logic level is "1", but the present embodiment is not limited thereto. For example, the interface circuit 80 may output the data signal DA with a first bit pattern when the logic level is "0", and may output the data signal DA with a second bit pattern when the logic level is "1". For example, in the data signal DA with the first bit pattern, a low level is output in a first-half period TF1, and a high level is output in a second-half period TL1. On the other hand, in the data signal DA with the second bit pattern, a low level is output in a first-half period TF2, and a high level is output in a second-half period TL2. Here, TF1>TF2 and TL1<TL2. In addition, TF1+TL1=TF2+TL2. The periods TF1, TL1, TF2, and TL2 are periods with a predetermined number of clocks. As an example, the period TF1 is a four-clock period of the clock signal CK, and the period TL1 is a three-clock period. The period TF2 is a two-clock period, and the period TL2 is a five-clock period. In this way, even when a frequency of the clock signal CK is high, an error can be prevented from occurring in the communication of the data signal DA generated based on the clock signal CK and an appropriate communication process can be implemented.

That is, no problem occurs when the frequency of the clock signal CK is a low frequency of, for example, 32 KHz in FIG. 13, but a communication error may occur when the frequency of the clock signal CK is a high frequency and the communication is performed using the clock signal CK. For example, when the communication of transmitting and receiving the data signal DA between the master and the slave in synchronization with the clock signal CK is performed and the frequency of the clock signal CK is high, sampling of the data signal DA is not performed in time, and the communication error occurs. In this regard, in the case in which the interface circuit 80 outputs the data signal DA with the first bit pattern when the logic level is "0" and outputs the data signal DA with the second bit pattern when the logic level is "1" as described above, the occurrence of such a communication error can be prevented. Accordingly, stable communication with high reliability between the master and the slave can be implemented.

The interface circuit 80 outputs the interruption signal INT, which reaches a predetermined voltage level in a given period, to the processing device 100 via the first pad PDA when the temperature detection data DTD is greater than the upper limit value UL or smaller than the lower limit value LL as shown in FIG. 10. For example, in FIG. 18, the interface circuit 80 outputs the interruption signal INT that reaches a low level, which is the predetermined voltage level, in a given period TA. For example, when the temperature detection data DTD is greater than the upper limit value UL or smaller than the lower limit value LL, the interface circuit 80 outputs the interruption signal INT that changes from a high impedance state to a low level in the period TA.

Figure 18:
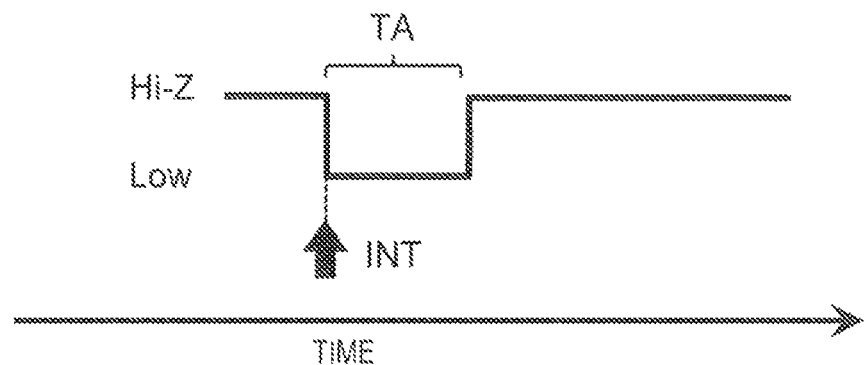
FIG. 18 is a diagram illustrating the interruption signal.

For example, since the data line of the data signal DA is pulled up by the resistor RP as shown in FIG. 13, the data line is in a state of being pulled up to a high level when the interface circuit 80 or the processing device 100 does not drive the data line to a low level. When the temperature detection data DTD is greater than the upper limit value UL or smaller than the lower limit value LL, the interface circuit 80 drives the data line to a low level, and outputs the interruption signal INT that reaches a low level in the period TA, as shown in FIG. 18. Accordingly, the processing device 100 can detect, by detecting the low level of the data line, that the interface circuit 80 outputs the interruption signal INT. The processing device 100 that detects the interruption signal INT can appropriately execute a process when the temperature is greater than the upper limit or smaller than the lower limit. For example, the processing device 100 can execute a warning process or the like of notifying that the temperature is greater than the upper limit or smaller than the lower limit.

5. Oscillator

Figure 19:
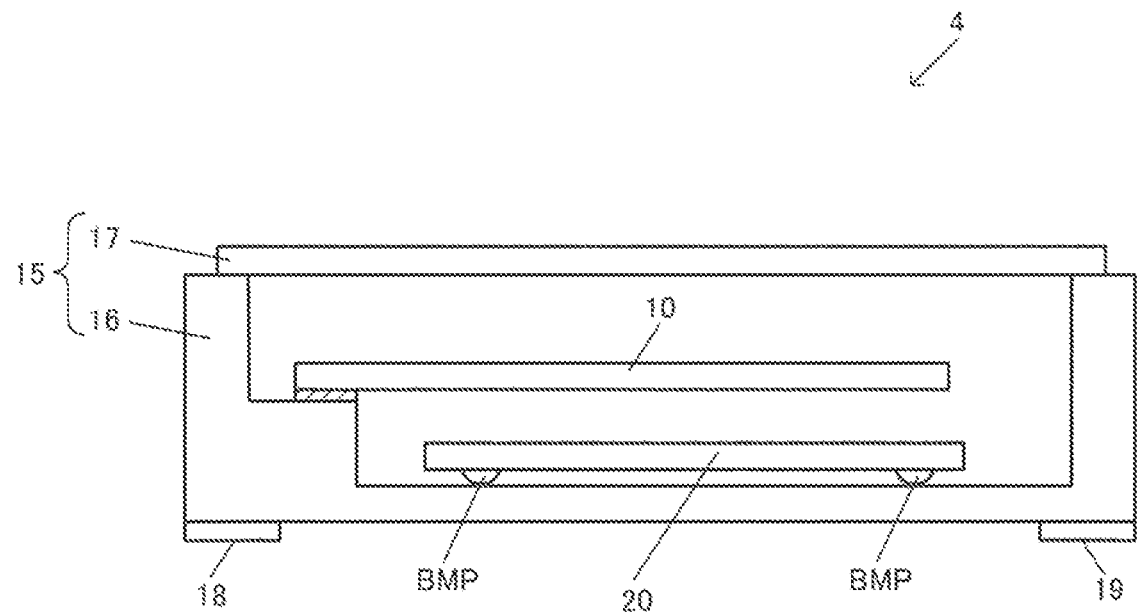
FIG. 19 is a first structure example of the oscillator.

FIG. 19 shows a first structure example of the oscillator 4 according to the present embodiment. The oscillator 4 includes the resonator 10, the circuit device 20, and a package 15 that houses the resonator 10 and the circuit device 20. The package 15 is made of, for example, ceramic, and has a housing space therein, and the resonator 10 and the circuit device 20 are housed in the housing space. The housing space is hermetically sealed, and is desirably in a decompressed state that is a state close to a vacuum. The package 15 can suitably protect the resonator 10 and the circuit device 20 from impact, dust, heat, moisture, and the like.

The package 15 includes a base 16 and a lid 17. Specifically, the package 15 includes the base 16 that supports the resonator 10 and the circuit device 20, and the lid 17 that is joined to an upper surface of the base 16 so as to form the housing space between the lid 17 and the base 16. The resonator 10 is supported by a step portion provided inside the base 16 via a terminal electrode. The circuit device 20 is disposed on an inner bottom surface of the base 16. Specifically, the circuit device 20 is disposed such that an active surface faces the inner bottom surface of the base 16. The active surface is a surface on which a circuit element of the circuit device 20 is formed. Bumps BMP are formed at terminals of the circuit device 20. The integrated circuit device 20 is supported by the inner bottom surface of the base 16 via the conductive bumps BMP. The conductive bumps BMP are, for example, metal bumps, and the resonator 10 is electrically coupled to the circuit device 20 via the bumps BMP, an internal wiring of the package 15, the terminal electrode, and the like. The circuit device 20 is electrically coupled to external terminals 18 and 19 of the oscillator 4 via the bumps BMP and the internal wiring of the package 15. The external terminals 18 and 19 are formed on an outer bottom surface of the package 15. The external terminals 18 and 19 are coupled to an external device via an external wiring. The external wiring is, for example, a wiring formed on a circuit board on which the external device is mounted. Accordingly, a clock signal or the like can be output to the external device.

In FIG. 19, the circuit device 20 is flip-chip mounted such that the active surface of the circuit device 20 faces downward, but the present embodiment is not limited to such mounting. For example, the circuit device 20 may be mounted such that the active surface of the circuit device 20 faces upward. That is, the circuit device 20 is mounted such that the active surface faces the resonator 10.

Figure 20:
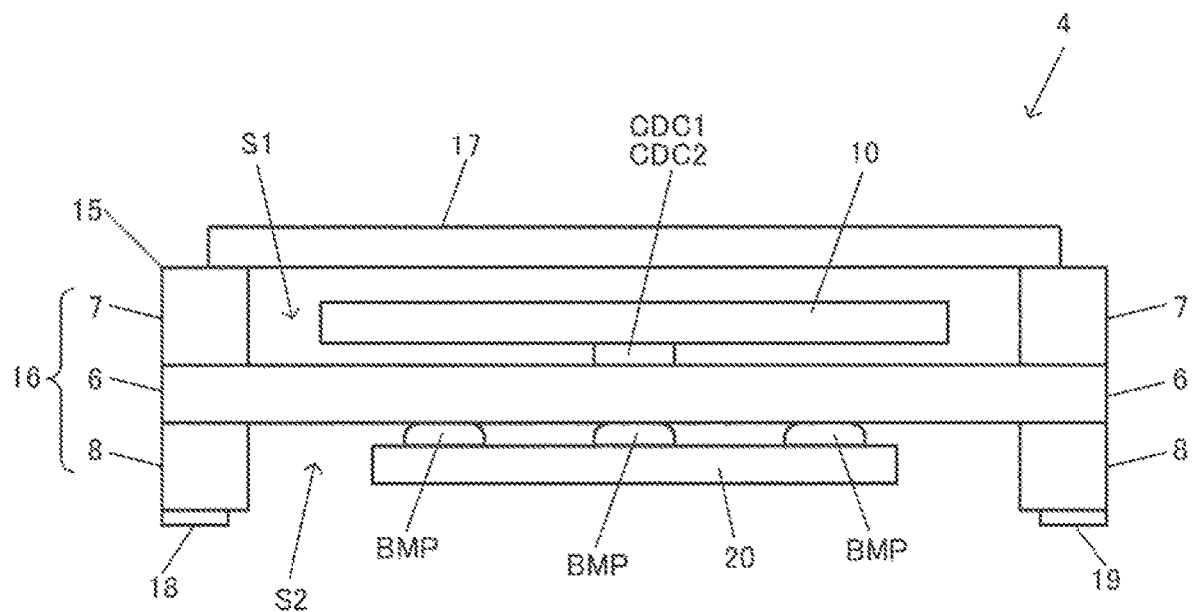
FIG. 20 is a second structure example of the oscillator.

FIG. 20 shows a second structure example of the oscillator 4. The oscillator 4 includes the resonator 10, the circuit device 20, and the package 15 that houses the resonator 10 and the circuit device 20, and the package 15 includes the base 16 and the lid 17. The base 16 includes a first substrate 6 that is an intermediate substrate, a second substrate 7 having a substantially rectangular frame shape that is laminated on an upper surface side of the first substrate 6, and a third substrate 8 having a substantially rectangular frame shape that is laminated on a bottom surface side of the first substrate 6. The lid 17 is joined to an upper surface of the second substrate 7, and the resonator 10 is housed in a housing space S1 formed by the first substrate 6, the second substrate 7, and the lid 17. For example, the resonator 10 is hermetically sealed in the housing space S1, and is desirably in a decompressed state that is a state close to a vacuum. Accordingly, the resonator 10 can be suitably protected from impact, dust, heat, moisture, and the like. The circuit device 20 that is a semiconductor chip is housed in a housing space S2 formed by the first substrate 6 and the third substrate 8. The external terminals 18 and 19 that are electrode terminals of the oscillator 4 for external coupling are formed on a bottom surface of the third substrate 8.

In the housing space S1, the resonator 10 is coupled to, via conductive coupling portions CDC1 and CDC2, a first electrode terminal and a second electrode terminal (not shown) formed on an upper surface of the first substrate 6. For example, the conductive coupling portions CDC1 and CDC2 may be implemented by a conductive bump such as a metal bump, or may be implemented by a conductive adhesive. Specifically, for example, a first electrode pad (not shown) formed at one end of the tuning-fork type resonator 10 is coupled to, via the conductive coupling portion CDC1, the first electrode terminal formed on the upper surface of the first substrate 6. The first electrode terminal is electrically coupled to the pad PX1 of the circuit device 20. A second electrode pad (not shown) formed at the other end of the tuning-fork type resonator 10 is coupled to, via the conductive coupling portion CDC2, the second electrode terminal formed on the upper surface of the first substrate 6. The second electrode terminal is electrically coupled to the pad PX2 of the circuit device 20. Accordingly, the one end and the other end of the resonator 10 can be electrically coupled to the pads PX1 and PX2 of the circuit device 20 via the conductive coupling portions CDC1 and CDC2. The conductive bumps BMP are formed on a plurality of pads of the circuit device 20 that is the semiconductor chip, and these conductive bumps BMP are coupled to a plurality of electrode terminals formed on a bottom surface of the first substrate 6. The electrode terminals coupled to the pads of the circuit device 20 are electrically coupled to the external terminals 18 and 19 of the oscillator 4 via the internal wiring and the like.

The oscillator 4 may be an oscillator of a wafer level package (WLP). In this case, the oscillator 4 includes a base including a semiconductor substrate and a penetration electrode penetrating a first surface and a second surface of the semiconductor substrate, the resonator 10 fixed to the first surface of the semiconductor substrate via a conductive joining member such as a metal bump, and an external terminal provided at a second surface side of the semiconductor substrate via an insulating layer such as a redistribution layer. An integrated circuit serving as the circuit device 20 is formed one the first surface or the second surface of the semiconductor substrate. In this case, by bonding a first semiconductor wafer on which a plurality of bases each including the resonator 10 and an integrated circuit with a second semiconductor wafer on which a plurality of lids are formed, the plurality of bases are joined to the plurality of lids, and then the oscillator 4 is diced by a dicing saw or the like. In this way, the oscillator 4 of the wafer level package can be implemented, and the oscillator 4 can be produced with a high throughput and a low cost.

As described above, a circuit device according to the present embodiment includes: an oscillation circuit configured to generate an oscillation signal using a resonator; a temperature sensor circuit configured to output temperature detection data; a temperature compensation circuit configured to perform, based on the temperature detection data, temperature compensation on an oscillation frequency of the oscillation signal; a memory configured to store correction data for correcting the temperature detection data to obtain a temperature; and an interface circuit configured to output the temperature detection data and the correction data.

According to the present embodiment, the oscillation circuit generates the oscillation signal using the resonator, and the temperature sensor circuit detects a temperature and outputs the temperature as the temperature detection data. The temperature compensation circuit performs the temperature compensation on the oscillation frequency of the oscillation signal based on the temperature detection data, and the memory stores the correction data for correcting the temperature detection data to obtain a temperature. The interface circuit outputs the temperature detection data and the correction data to the outside. Accordingly, a temperature corresponding to the temperature detection data can be detected by performing a calculation process of correcting the temperature detection data from the interface circuit based on the correction data from the interface circuit. Therefore, a circuit device or the like that can perform accurate temperature detection by effectively using the temperature sensor circuit of the circuit device can be provided.

In the present embodiment, the memory may store a look-up table in which the temperature detection data is associated with frequency adjustment data, and the temperature compensation circuit may output the frequency adjustment data corresponding to the temperature detection data with reference to the look-up table. The oscillation circuit may generate the oscillation signal with the oscillation frequency corresponding to the frequency adjustment data.

In this way, a temperature compensation process on the oscillation frequency can be performed by outputting, from the look-up table, the frequency adjustment data corresponding to the temperature detection data and adjusting the oscillation frequency of the oscillation circuit using the frequency adjustment data.

In the present embodiment, a calculation circuit configured to perform a calculation process of adjusting temperature sensitivity and output, to the look-up table, the temperature detection data subjected to the calculation process may be included.

In this way, for example, even when the temperature sensitivity varies depending on a temperature range, the temperature detection data after the calculation process can be output to the look-up table by performing a calculation process of appropriately adjusting the temperature sensitivity.

In the present embodiment, the memory may be a non-volatile memory.

In this way, the correction data for correcting the temperature detection data to obtain a temperature is stored in advance in the non-volatile memory, the correction data can be read from the non-volatile memory, and the correction data can be output together with the temperature detection data by the interface circuit.

In the present embodiment, the correction data may be coefficient data of a polynomial representing a relation between the temperature and the temperature detection data.

In this way, when a property indicating the relation between the temperature and the temperature detection data can be represented or approximated by the polynomial, the coefficient data of the polynomial can be used as the correction data.

In the present embodiment, an interruption signal generation circuit configured to generate an interruption signal when the temperature detection data is greater than an upper limit value or smaller than a lower limit value may be included.

When such an interruption signal generation circuit is provided, it is possible to notify an external device that the temperature corresponding to the temperature detection data is greater than an upper limit temperature or smaller than a lower limit temperature.

In the present embodiment, the interruption signal generation circuit may include a first register configured to store the upper limit value, a second register configured to store the lower limit value, and a comparison circuit configured to compare the temperature detection data with the upper limit value or the lower limit value to generate the interruption signal.

In this way, the upper limit value and the lower limit value are stored in advance in the first register and the second register, and the interruption signal can be generated by the comparison circuit comparing the upper limit value or the lower limit value with the temperature detection data.

In the present embodiment, the memory may store the upper limit value and the lower limit value.

In this way, the upper limit value and the lower limit value in which an individual difference variation is corrected based on the correction data can be written and stored in the memory.

In the present embodiment, a clock output pad, an output circuit configured to output a clock signal generated based on the oscillation signal to an external processing device via the clock output pad, and a first pad may be included, and the interface circuit may perform communication with the processing device based on a data signal. In the communication, the output circuit may output the clock signal to the processing device that is a master of the communication, and the interface circuit that is a slave of the communication receives, via the first pad, the data signal that is transmitted from the processing device and that is synchronized with the clock signal, or transmits the data signal to the processing device via the first pad in synchronization with the clock signal.

In this way, based on the clock signal output from a slave side, synchronous communication of the data signal is possible between the processing device that is the master of the communication and the interface circuit that is the slave of the communication.

In the present embodiment, the interface circuit may output, to the processing device via the first pad, an interruption signal that reaches a predetermined voltage level in a given period when the temperature detection data is greater than the upper limit value or smaller than the lower limit value.

In this way, the external processing device detects that, by detecting the predetermined voltage level of the data line, the interface circuit outputs the interruption signal, and the process when the temperature is greater than the upper limit or smaller than the lower limit can be appropriately performed.

An oscillator according to the present embodiment includes a resonator and a circuit device. The circuit device includes an oscillation circuit configured to generate an oscillation signal using the resonator, a temperature sensor circuit configured to output temperature detection data, a temperature compensation circuit configured to perform, based on the temperature detection data, temperature compensation on an oscillation frequency of the oscillation signal, a memory configured to store correction data for correcting the temperature detection data to obtain a temperature, and an interface circuit configured to output the temperature detection data and the correction data.

According to the present embodiment, the oscillation circuit generates the oscillation signal using the resonator, and the temperature sensor circuit detects a temperature and outputs the temperature as the temperature detection data. The temperature compensation circuit performs the temperature compensation on the oscillation frequency of the oscillation signal based on the temperature detection data, and the memory stores the correction data for correcting the temperature detection data to obtain a temperature. The interface circuit outputs the temperature detection data and the correction data to the outside. Accordingly, a temperature corresponding to the temperature detection data can be detected by performing a calculation process of correcting the temperature detection data from the interface circuit based on the correction data from the interface circuit. Therefore, an oscillator or the like that can perform accurate temperature detection by effectively using the temperature sensor circuit of the circuit device can be provided.

The oscillator according to the present embodiment may include a clock output terminal and a first terminal. The circuit device may include an output circuit configured to output a clock signal generated based on the oscillation signal to an external processing device via the clock output terminal, and the interface circuit may perform communication with the processing device based on a data signal. In the communication, the output circuit may output the clock signal to the processing device that is a master of the communication, and the interface circuit that is a slave of the communication may receive, via the first terminal, the data signal that is transmitted from the processing device and that is synchronized with the clock signal, or transmit the data signal to the processing device via the first terminal in synchronization with the clock signal.

In this way, based on the clock signal output from a slave side, synchronous communication of the data signal is possible between the processing device that is the master of the communication and the interface circuit that is the slave of the communication.

A processing system according to the present embodiment may include the oscillator described above and a processing device electrically coupled to the oscillator, in which the processing device may perform a calculation process of correcting the temperature detection data based on the correction data and detect the temperature.

In this way, since the calculation process of correcting the temperature detection data based on the correction data may be performed at a timing required in the entire processing system, power consumption in the entire processing system can be reduced.

Although the present embodiment has been described in detail as described above, it will be readily apparent to those skilled in the art that many modifications may be made without departing substantially from novel matters and effects according to the present disclosure. Therefore, all such modifications are intended to be included within the scope of the present disclosure. For example, a term cited with a different term having a broader meaning or the same meaning at least once in the specification or in the drawings can be replaced with the different term in any place in the specification or in the drawings. In addition, all combinations of this embodiment and the modifications are also included in the scope of the present disclosure. The configurations, operations, and the like of the circuit device, the oscillator, and the processing system are not limited to those described in the present embodiment, and various modifications can be made.

What is claimed is:

1. A circuit device comprising:
an oscillation circuit configured to generate an oscillation signal using a resonator;
a temperature sensor circuit configured to output temperature detection data;
a temperature compensation circuit configured to perform, based on the temperature detection data, temperature compensation on an oscillation frequency of the oscillation signal;
a memory configured to store correction data for correcting the temperature detection data to obtain a temperature, wherein the memory stores a look-up table in which the temperature detection data is associated with frequency adjustment data;
a calculation circuit configured to perform a calculation process of adjusting temperature sensitivity and output, to the look-up table, the temperature detection data subjected to the calculation process; and
an interface circuit configured to output the temperature detection data and the correction data,
wherein the temperature compensation circuit outputs the frequency adjustment data corresponding to the temperature detection data with reference to the look-up table, and the oscillation circuit generates the oscillation signal with the oscillation frequency corresponding to the frequency adjustment data.

2. The circuit device according to claim 1, further comprising:
a clock output pad;
an output circuit configured to output a clock signal generated based on the oscillation signal to an external processing device via the clock output pad; and
a first pad, wherein
the interface circuit performs communication with the processing device based on a data signal, and
in the communication,
the output circuit outputs the clock signal to the processing device that is a master of the communication, and
the interface circuit that is a slave of the communication receives, via the first pad, the data signal that is transmitted from the processing device and that is synchronized with the clock signal, or transmits the data signal to the processing device via the first pad in synchronization with the clock signal.

3. The circuit device according to claim 2, wherein
the interface circuit outputs, to the processing device via the first pad, an interruption signal that reaches a predetermined voltage level in a given period when the temperature detection data is greater than an upper limit value or smaller than a lower limit value.

4. The circuit device according to claim 1, wherein
the memory is a non-volatile memory.

5. The circuit device according to claim 1, wherein
the correction data is coefficient data of a polynomial representing a relation between the temperature and the temperature detection data.

6. The circuit device according to claim 1, further comprising:
an interruption signal generation circuit configured to generate an interruption signal when the temperature detection data is greater than an upper limit value or smaller than a lower limit value.

7. The circuit device according to claim 6, wherein
the interruption signal generation circuit includes
a first register configured to store the upper limit value,
a second register configured to store the lower limit value, and
a comparison circuit configured to compare the temperature detection data with the upper limit value or the lower limit value to generate the interruption signal.

8. The circuit device according to claim 6, wherein
the memory stores the upper limit value and the lower limit value.

9. A circuit device comprising:
an oscillation circuit configured to generate an oscillation signal using a resonator;
a temperature sensor circuit configured to output temperature detection data;
a temperature compensation circuit configured to perform, based on the temperature detection data, temperature compensation on an oscillation frequency of the oscillation signal;
a memory configured to store correction data for correcting the temperature detection data to obtain a temperature;
an interface circuit configured to output the temperature detection data and the correction data;
a clock output pad;
an output circuit configured to output a clock signal generated based on the oscillation signal to an external processing device via the clock output pad; and
a first pad, wherein
the interface circuit performs communication with the processing device based on a data signal, and
in the communication,
the output circuit outputs the clock signal to the processing device that is a master of the communication, and
the interface circuit that is a slave of the communication receives, via the first pad, the data signal that is transmitted from the processing device and that is synchronized with the clock signal, or transmits the data signal to the processing device via the first pad in synchronization with the clock signal.

10. The circuit device according to claim 9, wherein
the interface circuit outputs, to the processing device via the first pad, an interruption signal that reaches a predetermined voltage level in a given period when the temperature detection data is greater than an upper limit value or smaller than a lower limit value.

11. An oscillator comprising:
a resonator;
a circuit device, wherein
the circuit device includes
an oscillation circuit configured to generate an oscillation signal using the resonator, a temperature sensor circuit configured to output temperature detection data,
a temperature compensation circuit configured to perform, based on the temperature detection data, temperature compensation on an oscillation frequency of the oscillation signal,
a memory configured to store correction data for correcting the temperature detection data to obtain a temperature, and
an interface circuit configured to output the temperature detection data and the correction data;
a clock output terminal; and
a first terminal, wherein
the circuit device further includes an output circuit configured to output a clock signal generated based on the oscillation signal to an external processing device via the clock output terminal,
the interface circuit performs communication with the processing device through a data signal, and
in the communication,
the output circuit outputs the clock signal to the processing device that is a master of the communication, and
the interface circuit that is a slave of the communication receives, via the first terminal, the data signal that is transmitted from the processing device and that is synchronized with the clock signal, or transmits the data signal to the processing device via the first terminal in synchronization with the clock signal.

12. A processing system comprising:
an oscillator, wherein
the oscillator includes
a resonator; and
a circuit device, wherein
the circuit device includes
an oscillation circuit configured to generate an oscillation signal using the resonator, a temperature sensor circuit configured to output temperature detection data,
a temperature compensation circuit configured to perform, based on the temperature detection data, temperature compensation on an oscillation frequency of the oscillation signal,
a memory configured to store correction data for correcting the temperature detection data to obtain a temperature, and
an interface circuit configured to output the temperature detection data and the correction data; and
a processing device electrically coupled to the oscillator, wherein
the processing device performs a calculation process of correcting the temperature detection data based on the correction data and detects the temperature.

* * * * *